(12) United States Patent
Ide et al.

(10) Patent No.: US 9,171,588 B2
(45) Date of Patent: Oct. 27, 2015

(54) SEMICONDUCTOR DEVICE CAPABLE OF PERFORMING A READ LEVELING AND A WRITE LEVELING BASED ON AN AMBIENT TEMPERATURE

(71) Applicant: Micron Technology, Inc., Boise, ID (US)

(72) Inventors: Akira Ide, Tokyo (JP); Naoki Ogawa, Tokyo (JP)

(73) Assignee: Micron Technology, Inc., Boise, ID (US)

(*) Notice: Subject to any disclaimer, the term of this patent is extended or adjusted under 35 U.S.C. 154(b) by 30 days.

(21) Appl. No.: 14/223,928

(22) Filed: Mar. 24, 2014

(65) Prior Publication Data

US 2014/0286112 A1 Sep. 25, 2014

(30) Foreign Application Priority Data

Mar. 25, 2013 (JP) ................. 2013-061703

(51) Int. Cl.
*G11C 7/04* (2006.01)
*G11C 5/04* (2006.01)
*G11C 7/10* (2006.01)
*G11C 7/22* (2006.01)

(52) U.S. Cl.
CPC .. *G11C 7/04* (2013.01); *G11C 5/04* (2013.01); *G11C 7/106* (2013.01); *G11C 7/1039* (2013.01); *G11C 7/1066* (2013.01); *G11C 7/1087* (2013.01); *G11C 7/1093* (2013.01); *G11C 7/222* (2013.01)

(58) Field of Classification Search
CPC ............. G11C 7/04; G11C 7/08; G11C 7/22; G11C 11/4076; G11C 2207/2281; G11C 2207/229
USPC ............ 365/189.15, 189.16, 189.14, 189.17, 365/189.05, 194, 211, 51, 63
See application file for complete search history.

(56) References Cited

U.S. PATENT DOCUMENTS

| 6,373,313 | B1 * | 4/2002 | Hishiyama .................... 327/276 |
| 6,735,137 | B2 * | 5/2004 | Jung et al. ..................... 365/211 |
| 7,187,599 | B2 * | 3/2007 | Schnell et al. ................ 365/194 |
| 7,469,354 | B2 * | 12/2008 | Minzoni et al. ............... 713/503 |
| 2011/0093735 | A1 | 4/2011 | Yoko et al. | |
| 2013/0258788 | A1 | 10/2013 | Ide et al. | |

* cited by examiner

*Primary Examiner* — Andrew Q Tran
(74) *Attorney, Agent, or Firm* — Dorsey & Whitney LLP

(57) ABSTRACT

Disclosed herein is an apparatus that includes a first semiconductor chip including a first electrode, and a second semiconductor chip including a second electrode connected to the first electrode. One of the first and second semiconductor chips includes a first temperature sensor circuit generating a first detection signal, the first detection signal taking a first level when a temperature is equal to or higher than a first temperature, the first detection signal taking a second level when the temperature is lower than the first temperature; and a first delay code generation circuit outputting a first delay code signal in response to the first level of the first detection signal, and outputting a second delay code signal different from the first delay code signal in response to the second level of the first detection signal.

20 Claims, 23 Drawing Sheets

SEMICONDUCTOR DEVICE CAPABLE OF PERFORMING A READ LEVELING AND A WRITE LEVELING BASED ON AN AMBIENT TEMPERATURE

BACKGROUND

1. Field of the Invention

Embodiments of the present invention relates to a semiconductor device, and particularly to a semiconductor device in which a front-end section having an interface function and a back-end section having a memory core are integrated on different semiconductor chips.

2. Description of Related Art

The storage capacity required for a semiconductor memory device such as a DRAM (Dynamic Random Access Memory) has been increasing year after year. In order to meet such a demand, a memory device called a multi-chip package in which a plurality of memory chips are stacked has been proposed in recent years. However, each of the memory chips included in the multi-chip package has a so-called frontend section which interfaces with the outside (a memory controller, for example) because each of the memory chips itself is a usual memory chip which operates alone. Therefore, the occupied area allocatable to a memory core in each of the memory chips is limited to the area which is obtained by subtracting the occupied area for the frontend section from the total area. It is thus difficult to increase the storage capacity per a memory chip substantially.

Furthermore, there is a problem that it is difficult to speedup transistors constituting the frontend section because the frontend section and the backend section including the memory core are produced simultaneously despite the circuits constituting the frontend section belong to a so-called logic circuits.

As a solution to such problems, a method to configure a semiconductor device by integrating the frontend section and the backend section in separate chips and stacking the chips is proposed. According to the method, as for a core chip which is integrated with the backend section, it becomes possible to increase the storage capacity per a chip (per a core chip) because the occupied area allocatable to the memory core increases. At the same time, as for an interface chip which is integrated with the frontend section, it becomes possible to configure the circuits with fast transistors because it can be produced by a process different from those for the core chip. In addition, because it is also possible to allocate a plurality of core chips to an interface chip, it becomes possible to offer a high-speed semiconductor device with a very large-capacity as a whole.

As for such a semiconductor device, Japanese Patent Application Laid-Open No. 2011-081731 discloses a technique for securing a sufficient temporal margin (latch margin) for a process in which the interface chip captures read data. According to the technique, in a core chip, a replica circuit of a circuit pertaining to outputting of read data, and an output timing adjustment circuit that controls an output timing of read data are provided. In an interface chip, a process monitor circuit containing a variable delay circuit is provided. The process monitor circuit adjusts an amount of delay by the variable delay circuit in such a way that it becomes equal to an amount of delay in the replica circuit and reflect the result in the output timing adjustment circuit. By adjusting the timing of when each of the core chips outputs read data in that manner, it becomes possible to secure a sufficient latch margin for a process in which the interface chip captures read data.

In a semiconductor device of a type that uses an interface chip, for example, when a writing operation is performed, write data is input to the interface chip from an external controller via a data input/output terminal. The interface chip generates a control signal (referred to as a "second control signal", hereinafter) based on a write command, and outputs the write data to a core chip at a timing determined by the second control signal. Meanwhile, the core chip also generates a control signal (referred to as a "first control signal", hereinafter) based on the write command, and receives the write data from the interface chip at a timing determined by the first control signal.

The write data is transmitted to each core chip by the mechanism described above. Therefore, the first control signal needs to be synchronized with the second control signal. If there is a certain amount or more of deviation from the state of synchronization, the writing operation cannot be properly performed. An acceptable range of deviation from the state of synchronization is referred to as a "timing margin".

A configuration has been previously developed for ensuring the first and second control signals are synchronized. This configuration can deal with both the situation where the first control signal advances ahead of the second control signal and the situation where the first control signal is delayed relative to the second control signal. In the former case, a delay adjustment circuit is provided between a circuit (write control timing adjustment circuit) that generates the first control signal, and a circuit (command generation circuit) that generates an internal command inside the core chip. The delay adjustment circuit is a circuit that delays a timing at which an internal write command generated by the command generation circuit is supplied to the write control timing adjustment circuit. The larger the amount of delay by the delay adjustment circuit becomes, the more the generation timing of the first control signal is delayed. An amount of delay that should be set in the delay adjustment circuit is measured through attempts of writing operation in production-process tests, and the amount is then set in the delay adjustment circuit.

In the case of the configuration, one possible problem is that a write recovery time tWR (or a period of time from when an inputting of write data to the data input/output terminal is completed to when it becomes possible to input a precharge command) becomes longer. That is, the operation speed of the semiconductor device varies according to temperature. The amount of advancement of the first control signal relative to the second control signal varies according to temperature, too. Therefore, in order to support all temperatures, the amount of delay is inevitably set based on a temperature at which the amount of advancement of the first control signal relative to the second control signal is maximized. Ideally speaking, a process by the core chip of capturing the write data (or a process of capturing at a timing determined by the first control signal) should be carried out immediately after the write data is output from the interface chip at a timing determined by the second control signal. However, as a result of setting the amount of delay as described above, depending on temperature, there might be a time lag between the outputting of the write data (from the interface chip) and the capturing (by the core chip) of the write data. Consequently, the write recovery time becomes longer.

The above description is true of a reading operation. In the case of the reading operation, one possible problem is that an address access time tAA (or a period of time from when an inputting of a column address to an address terminal is started to when an outputting of the read data from the data input/output terminal is completed) becomes longer.

That is, the problem with the configuration is that, in the reading and the writing operation, an optimal amount of delay acquired when the temperature is low is not optimal when the temperature is high (and vice versa).

SUMMARY

Disclosed are embodiments able to perform reading and writing operation at an optimal signal timing in both a high-temperature operation or a low-temperature operation.

In one embodiment, there is provided a device, including: a first semiconductor chip that includes a first electrode; and a second semiconductor chip that includes a second electrode which is connected to the first electrode, one of the first and second semiconductor chips including: a first temperature sensor circuit that generates a first detection signal of a first level when a temperature of a mounted chip is equal to or higher than a first temperature, and generates the first detection signal of a second level when the temperature is lower than the first temperature, and a first delay code generation circuit that outputs a first delay code signal in response to the first level of the first detection signal, and outputs a second delay code signal different from the first delay code signal in response to the second level of the first detection signal.

In one embodiment, there is provided a method including: sensing a temperature of a device including a first semiconductor chip including a first electrode and a second semiconductor chip including a second electrode connected to the first electrode; generating a first detection signal taking one of first and second levels in response to the temperature; and generating a first delay code signal in response to the first level of the first detection signal and generating a second delay code signal in response to the second level of the first detection signal, the first and second delay code signals being different from each other.

In one embodiment, there is provided a system including: a memory controller; a device on which the memory controller performs at least one of a write leveling and a read leveling, the device including first and second chips on which a timing adjustment of inputting and outputting of data are performed, and the device including a first circuit configured to generate one of first and second delay code signals in response to a temperature to perform the timing adjustment of inputting and outputting of data, the first and second delay code signals being different from each other.

DETAILED DESCRIPTION OF THE EMBODIMENTS

Embodiments of the present invention will be explained below in detail with reference to the accompanying drawings.

Figure 1:
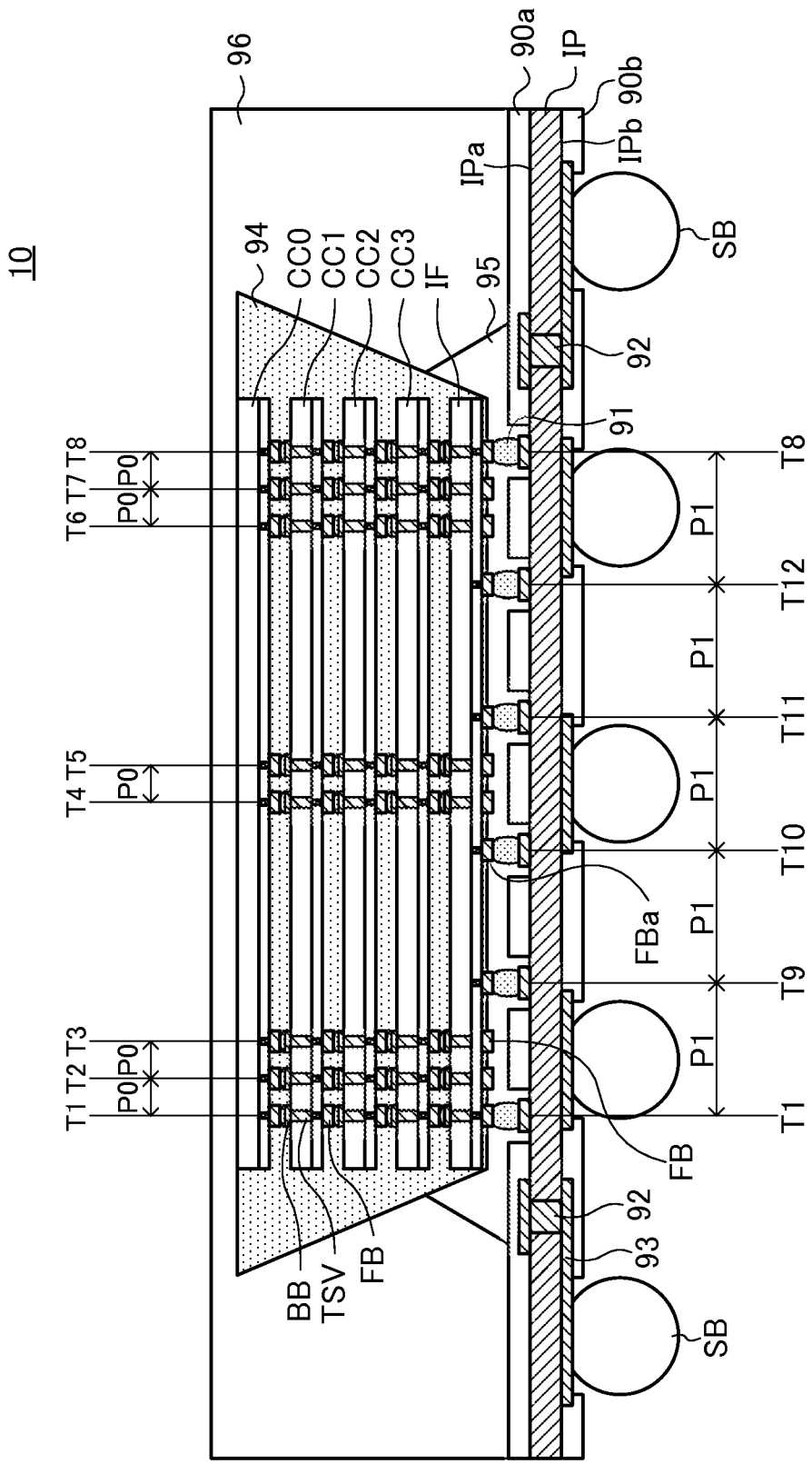
FIG. 1 is a schematic cross-sectional view of a structure of a semiconductor device according to an embodiment of the present invention.

FIG. 1 is a schematic cross-sectional view of a structure of a semiconductor device 10 according to an embodiment of the present invention.

As shown in FIG. 1, the semiconductor device 10 of the embodiment has a structure in which the following components are stacked: four core chips CC0 to CC3, which have the same functions and are produced with the use of the same production mask; one interface chip IF, which is produced with the use of a different production mask from that of the core chips CC0 to CC3; and one interposer IP. The core chips CC0 to CC3 and the interface chip IF are semiconductor chips for which a silicon substrate is used, and are stacked by a face down method on the interposer IP. The face down method means a method of mounting semiconductor chips in such a way that principal surfaces on which electronic circuits such as transistors are formed face downward, or that the principal surfaces face the interposer IP's side.

However, the semiconductor device of the present invention is not limited to the above structure. The semiconductor chips each may be stacked by a face up method. The face up method means a method of mounting semiconductor chips in such a way that principal surfaces on which electronic circuits such as transistors are formed face upward, or that the principal surfaces face a side opposite to the interposer IP's side. Alternatively, the semiconductor chips stacked by the face down method, and the semiconductor chips stacked by the face up method may exist together.

The semiconductor chips other than the core chip CC0 placed on the top layer among the semiconductor chips, that is, the core chips CC1 to CC3 and the interface chip IF are provided with large numbers of penetrating electrodes TSV (Through Substrate Via) each passing through a silicon substrate. In areas that overlap with each of the penetrating electrodes TSV in planar view seen from a stacking direction, top surface bumps FB are provided on the principal surface sides of the chips, and back surface bumps BB are provided on the back surface sides of the chips. The back surface bumps BB of a semiconductor chip placed on a lower layer are bonded to the top surface bumps FB of a semiconductor chip placed on an upper layer. In this manner, the semiconductor chips that are adjacent to each other in the vertical direction are electrically connected.

The reason why no penetrating electrode TSV is provided on the top layer core chip CC0 in the present embodiment is because there is no need to form a bump electrode on the back surface side of the core chip CC0 as the chips are stacked by the face down method. If no penetrating electrode TSV is provided on the top layer core chip CC0 as described above, the top layer core chip CC0 can be made thicker than the other core chips CC1 to CC3 to increase the mechanical strength of the core chip CC0. However, in an embodiment of the present invention, penetrating electrodes TSV may be provided on the top layer core chip CC0. In this case, all the core chips CC0 to CC3 can be produced by the same process.

The core chips CC0 to CC3 are semiconductor chips made by removing the so-called frontend section, which serves as an interface with the outside, from circuit blocks contained in a typical SDRAM (Synchronous Dynamic Random Access Memory) that operates alone. In other words, the core chips CC0 to CC3 are memory chips on which circuit blocks belonging to the backend section are integrated. The circuit blocks contained in the frontend section include, for example, a parallel-to-serial conversion circuit which performs parallel-to-serial conversion of input/output data between a memory cell array and a data input/output terminal, a DLL (Delay Locked Loop) circuit which controls an input/output timing of data, and the like.

Meanwhile, the interface chip IF is a semiconductor chip on which circuit blocks of the frontend section are integrated, among circuit blocks contained in a typical SDRAM that operates alone. The interface chip IF functions as a common frontend section for the four core chips CC0 to CC3. Therefore, all accesses from the outside are conducted through the interface chip IF, and inputting and outputting of data are performed through the interface chip IF.

The interposer IP is a circuit board made of resin. On a back surface IPb thereof, a plurality of external terminals (solder balls) SB are formed. The interposer IP ensures the mechanical strength of the semiconductor device 10 and functions as a rewiring substrate to expand an electrode pitch. That is, substrate electrodes 91 that are formed on a top surface IPa of the interposer IP are led out to the back surface IPb via through hole electrodes 92; rewiring layers 93 that are provided on the back surface IPb are designed to expand the pitch of the external terminals SB. The areas of the top surface IPa of the interposer IP where no substrate electrode 91 is formed are covered with resist 90a. The areas of the back surface IPb of the interposer IP where no external terminal SB is formed are covered with resist 90b. FIG. 1 shows only five external terminals SB. However, a large number of external terminals is actually provided. The layout of the external terminals SB is the same as that of a SDRAM determined by the standard. Accordingly, an external controller can handle the semiconductor device 10 as a SDRAM.

The gaps between the core chips CC0 to CC3 and interface chip IF stacked are filled with underfill 94. In this manner, the mechanical strength is ensured. The gap between the interposer IP and the interface chip IF is filled with NCP (Non-Conductive Paste) 95. The entire package is covered with mold resin 96. In this manner, each chip is physically protected.

The penetrating electrodes TSV provided in the core chips CC1 to CC3 and interface chip IF are arranged at a pitch P0 which is a processible minimum pitch or a slightly wider pitch than the processible minimum pitch, in order to curb an increase in the chip size. The value of the pitch P0 is for example about 40 to 50 μm. Meanwhile, the substrate electrodes 91 provided on the interposer IP are arranged at a pitch P1 (>P0) which is a minimum pitch allowed according to a wiring rule of the interposer IP or a slightly wider pitch than the minimum pitch. The value of the pitch P1 is for example about 75 to 150 μm. Although not specifically limited, the pitch P1 may be set to P1=P0×2. In FIG. 1, each of the core chips CC1 to CC3 and interface chip IF has eight penetrating electrodes TSV arranged in lines T1 to T8 and the interface chip IF has six top surface bumps FB arranged in lines T1 and T8 to T12. However, greater numbers of penetrating electrodes TSV and top surface bumps FB may be provided in some embodiments. As shown in FIG. 1, the top surface bumps FB provided on the interface chip IF includes what are bonded to the substrate electrodes 91 on the interposer IP and what are not bonded to the substrate electrodes 91 on the interposer IP.

Most of the penetrating electrodes TSV provided on the core chips CC1 to CC3 are connected to the top surface bumps FB and back surface bumps BB that are provided at the same locations in planar view. In the present embodiment, the penetrating electrodes of such a kind are represented by penetrating electrodes TSV1. All the penetrating electrodes TSV belonging to lines T1 to T8 shown in FIG. 1 are penetrating electrodes TSV1.

On the other hand, most of the penetrating electrodes TSV provided on the interface chip IF are connected to the back surface bumps BB that are provided at the same locations in planar view, but not connected to the top surface bumps FB that are provided at the same locations in planar view. In the present embodiment, the penetrating electrodes of such a kind are represented by penetrating electrodes TSV2. In FIG. 1, the penetrating electrodes TSV corresponding to lines T2 to T7 of the penetrating electrodes TSV provided on the interface chip IF are the penetrating electrodes TSV2.

Figure 2:
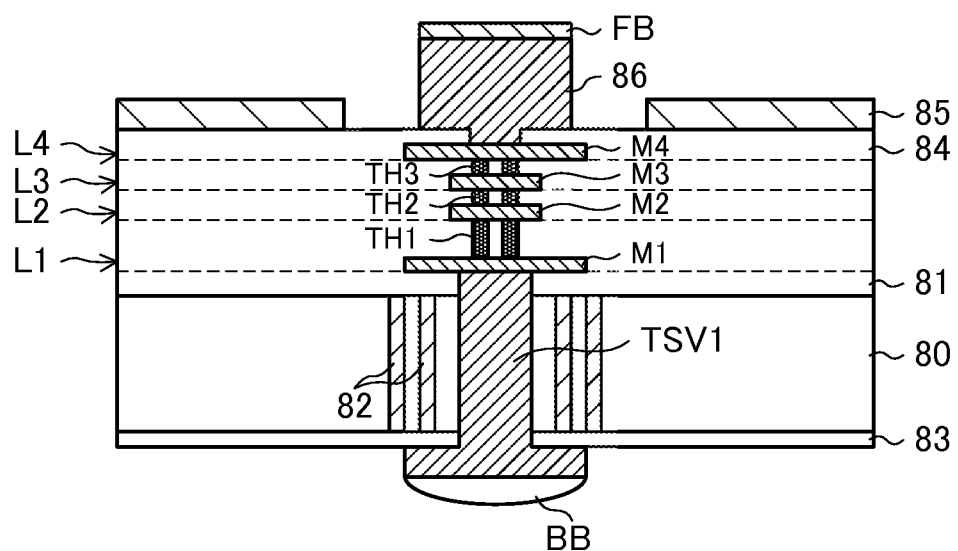
FIG. 2 is a cross-sectional view of a structure of a penetrating electrode according to an embodiment of the invention.
Figure 3:
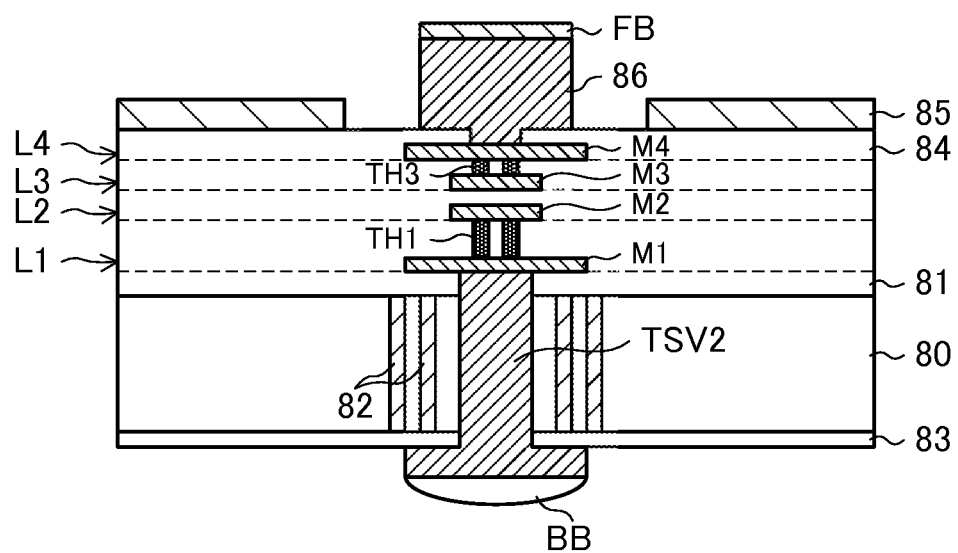
FIG. 3 is a cross-sectional view of a structure of a penetrating electrode according to an embodiment of the invention.

FIGS. 2 and 3 are cross-sectional views of penetrating electrodes TSV1 and TSV2, respectively, according to an embodiment of the invention.

As shown in FIG. 2, the penetrating electrode TSV1 is so provided as to pass through a silicon substrate 80, an interlayer insulation film 81 which is provided on a top surface of the silicon substrate 80, and a passivation film 83 which is provided on a back surface of the silicon substrate 80. Although not specifically limited, the penetrating electrode TSV1 may be made of Cu (copper). The top surface of the silicon substrate 80 (the upper surface in FIG. 2) serves as a device formation surface on which devices such as transistors are formed. Around the penetrating electrode TSV1, insulation rings 82 are provided to insulate the penetrating electrode TSV1 from a transistor region. In the example shown in FIG. 2, two insulation rings 82 are provided to reduce capacitance between the penetrating electrode TSV1 and the silicon substrate 80. Incidentally, one insulation ring 82, instead of two, may be provided.

An end portion of the penetrating electrode TSV1 that is closer to the back surface of the silicon substrate 80 is covered with a back surface bump BB. As shown in FIG. 1, the back surface bumps BB provided on the core chips CC1 to CC3 are in contact with the top surface bumps FB provided on upper layer core chips CC0 to CC2, respectively. The back surface bumps BB provided on the interface chip IF are in contact with the top surface bumps FB provided on the core chip CC3. Although not specifically limited, the back surface bumps BB may be made of SnAg solder covering the surfaces of the penetrating electrodes TSV1.

On the top surface of the silicon substrate 80, insulation films as many as five layers are formed. The above-mentioned interlayer insulation film 81 is one of the insulation films. The topmost layer is a passivation film 84. On the top surface of each of the layers except for the passivation film 84, wiring layers L1 to L4 are formed, respectively, in order from the nearest to the top surface of the silicon substrate 80. The wiring layers L1 to L4 are configured to include pads M1 to M4, respectively. The pad M1 of them is in contact with an end portion of the penetrating electrode TSV1 that is closer to the top surface of the silicon substrate 80. In each of the layers except for the above-mentioned interlayer insulation film 81 and the passivation film 84, a plurality of through hole electrodes TH1 to TH3, respectively, in order from the nearest to the top surface of the silicon substrate 80. The pads M1 to M4 are connected each other by the through hole electrodes TH1 to TH3.

The top surface bump FB is connected to the pad M4 through a pillar portion 86 which penetrates through the passivation film 84. Therefore, the top surface bump FB is connected to an end portion of the penetrating electrode TSV1 via the pillar portion 86, the pads M1 to M4, and the through hole electrodes TH1 to TH3. As shown in FIG. 1, the top surface bumps FB provided on the core chips CC1 to CC3 are in contact with the back surface bumps BB provided on the lower-layer core chips CC2 and CC3 and the interface chips IF, respectively. The top surface bumps FB provided on the interface chip IF are in contact with the substrate electrodes 91 on the interposer IP. Although not specifically limited, the top surface bumps FB include a pillar portion 86 that may be made of Cu (copper). A surface of the pillar portion 86 includes a stacking structure of Ni (nickel) and Au (gold). The diameter of the top surface bumps FB and back surface bumps BB may be about 20 μm.

A top surface of the passivation film 84 except a region where the top surface bump FB is formed is covered with a polyimide film 85. Incidentally, the connection to internal circuits not shown in the diagram is realized via internal wires (not shown), which are led out from the pads M1 to M3 provided in the wiring layers L1 to L3.

In that manner, the penetrating electrodes TSV1 are connected to the top surface bumps FB and back surface bumps BB that are provided at the same locations in planar view with respect to the same chip.

In contrast to this, with respect to the penetrating electrodes TSV2, as shown in FIG. 3, the through hole electrodes TH2 connecting the pad M2 and the pad M3 provided at the same location in planar view is not provided. Therefore, the top surface bumps FB and back surface bumps BB that are provided at the same locations in planar view are not short-circuited. For the rest, the penetrating electrodes TSV1 and the penetrating electrodes TSV2 have the same structure.

Figure 4:
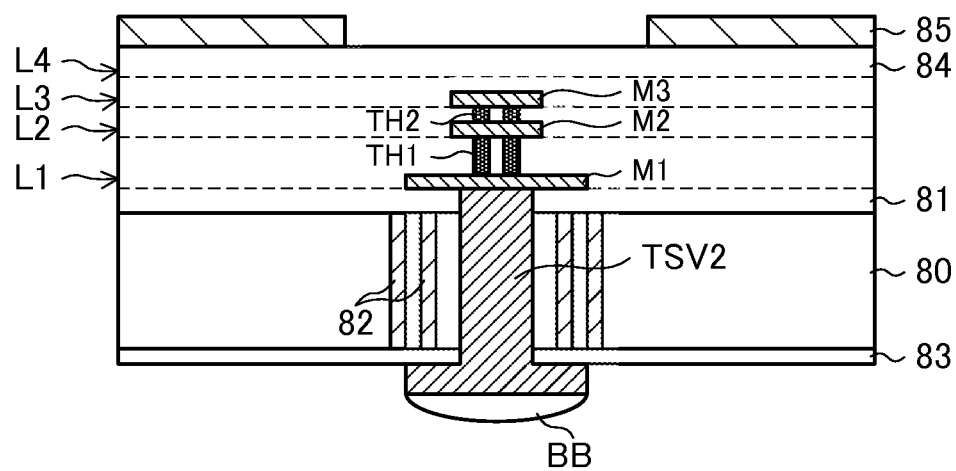
FIG. 4 is a cross-sectional view of a penetrating electrode according to an embodiment of the invention.

FIG. 4 is a cross-sectional view of the penetrating electrode TSV2 according to an embodiment of the invention. The top surface bumps FB of the penetrating electrodes TSV2 corresponding to lines T2 to T7 shown in FIG. 1 are not connected to the substrate electrodes 91 provided on the interposer IP. In such a case, not providing the top surface bumps FB as shown in FIG. 4 is allowed.

The penetrating electrodes TSV2 provided on the interface chip IF, as shown in lines T2 to T7 of FIG. 1, constitute signal paths each of which is connected to the interface chip IF and the core chips CC0 to CC3 in common, in conjunction with the penetrating electrodes TSV1 provided on each of the core chips CC1 to CC3. The signals which the interface chip IF outputs via the signal paths are input into the core chips CC0 to CC3 in common. The signals which each of the core chips CC0 to CC3 outputs via the signal paths are subjected to a Wired-OR operation before being input into the interface chip IF. The signals being output or input like this include command signals, address signals, and data signals, and the like. Meanwhile, in each of the chips, input and output of the signals with respect to the internal circuit (not shown) is performed via the pads M1 to M4.

On the other hand, the penetrating electrodes TSV1 provided on the interface chip IF, as shown in lines T1 to T8 of FIG. 1, also constitute signal paths each of which is connected to the interface chip IF and the core chips CC0 to CC3 in common, in conjunction with the penetrating electrodes TSV1 provided on each of the core chips CC1 to CC3. The signal paths are connected to the external terminals SB and are used mainly for supplying power supply potential.

Although not shown in FIG. 1, the penetrating electrodes TSV2 having a structure shown in FIG. 3 are also used in the core chips CC1 to CC3. The penetrating electrodes TSV2 provided on the core chips CC1 to CC3 are used to sequentially transfer predetermined information to the internal circuits (not shown) provided on each of the core chips CC0 to CC3, and to input unique information. The information includes chip address information, defective chip information, and the like.

Furthermore, on the interface chip IF, top surface bumps FBa on which penetrating electrodes TSV are not provided at the same plane positions are provided as well. In FIG. 1, this kind of the top surface bumps FBa are provided in Lines T9 to T12.

Figure 5:
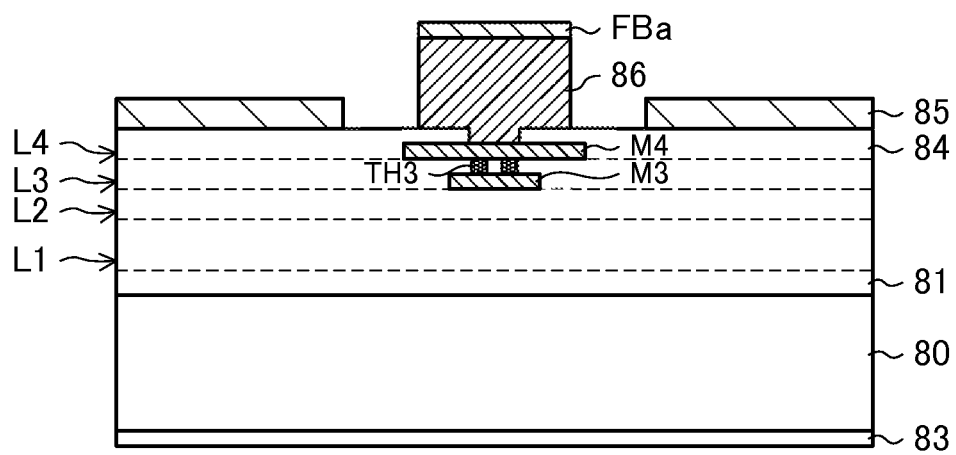
FIG. 5 is a cross-sectional view of a structure of a top surface bump according to an embodiment of the invention.

FIG. 5 is a cross-sectional view of a top surface bump FBa according to an embodiment of the invention.

Turning to FIG. 5, the top surface bump FBa provided on the interface chip IF is connected to the pads M4 and M3. Below the pads M4 and M3, the pads M2 and M1, the penetrating electrodes TSV, and the back surface bump BB are not provided. The pads M4 and M3 are connected to logic circuits and other circuits in the interface chip IF, which are not shown in the diagram.

The above has described the configuration of the semiconductor device 10. The following describes example circuit configurations of the semiconductor device 10.

Figure 6:
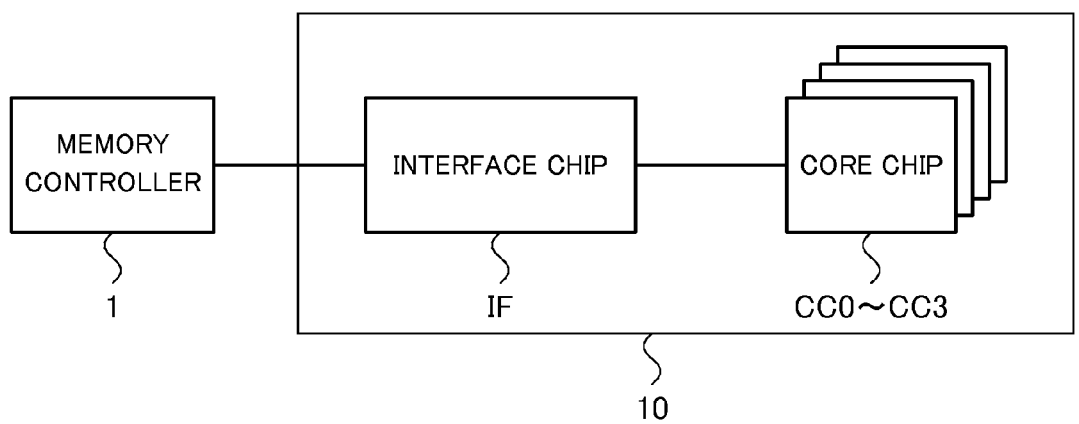
FIG. 6 is a diagram showing the relation of connection between a semiconductor device according to the embodiment of the present invention and an external memory controller.

First, FIG. 6 is a diagram showing an apparatus including the semiconductor device 10 according to an embodiment of the invention and an external memory controller 1. As used herein, apparatus may refer to, for example, an integrated circuit, a memory device, a memory system, an electronic device or system, a smart phone, a tablet, a computer, a server, etc. As shown in FIG. 6, the memory controller 1 is connected to each of the core chips CC0 to CC3 via the interface chip IF. Between the memory controller 1 and the semiconductor device 10, a write leveling (a process in which the memory controller adjusts a timing when the write data reaches a SDRAM) and a read leveling (a process in which the memory controller detects a timing when the read data is output from a SDRAM) are carried out. Between the interface chip IF and each of the core chips CC0 to CC3, timing adjustment of inputting and outputting of data, which is associated with an embodiment of the present invention, is performed.

<Configuration of Semiconductor Device 10 According to a First Embodiment>

Figure 7:
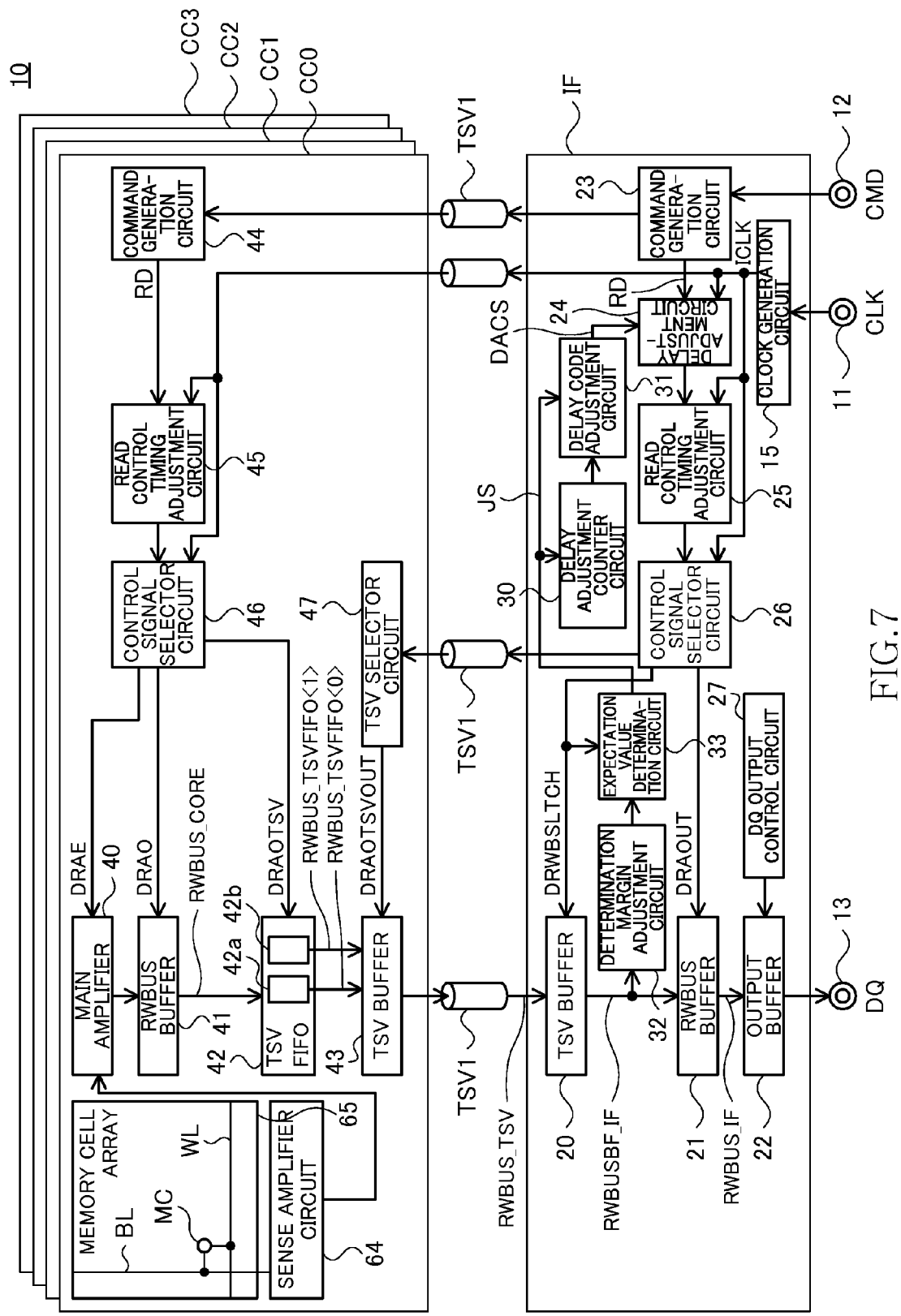
FIG. 7 is a block diagram showing a configuration related to a read operation out of a semiconductor device according to an embodiment of the present invention.
Figure 8:
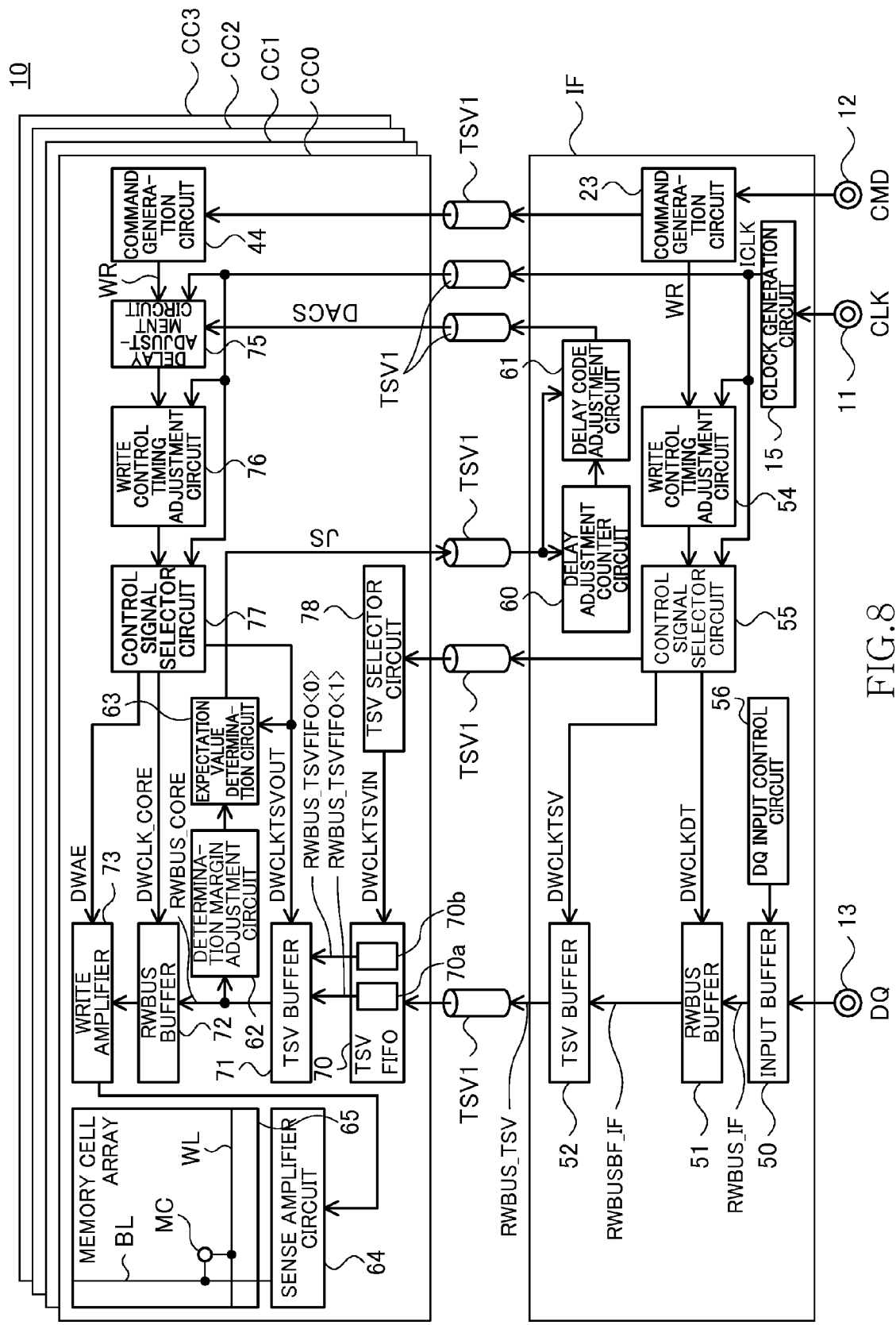
FIG. 8 is a block diagram showing a configuration related to a write operation out of a semiconductor device according to an embodiment of the present invention.

Next, FIGS. 7 and 8 are block diagrams showing configurations of the semiconductor device 10 according to an embodiment of the present invention.

FIG. 7 shows the configuration of a semiconductor device according to an embodiment of the present invention related to an operation (read operation) in which read data are read out from memory cells.

FIG. 8 shows the configuration of a semiconductor device according to an embodiment of the present invention related to an operation (write operation) in which write data are written in memory cells.

As shown in FIGS. 7 and 8, the external terminals provided in the interposer IP include clock terminals 11, command terminals 12, and data input/output terminals 13. Other terminals, such as address terminals, data strobe terminals, calibration terminals, and power-supply terminals, are also provided, but are not shown in the diagrams. Of the external terminals described above, all the external terminals except the power-supply terminal are connected to internal circuits in the interface chip IF, and are not connected directly to internal circuits in the core chips CC0 to CC3.

The clock terminal 11 is a terminal to which an external clock signal CLK is supplied. The supplied external clock signal CLK is supplied to a clock generation circuit 15. The clock generation circuit 15 is a circuit that generates an internal clock signal ICLK. The generated internal clock signal ICLK is supplied to various circuit blocks in the interface chip IF and core chips CC0 to CC3.

The command terminal 12 is a terminal to which command signals CMD are supplied: The command signals CMD include a row address strobe signal, a column address strobe signal, a write enable signal, a chip select signal, and a clock enable signal. The command signals CMD are supplied to a command generation circuit 23 (a first command generation circuit) of the interface chip IF and to a command generation circuit 44 (a second command generation circuit) of each of the core chips CC0 to CC3. To the command generation circuits 44, the command signals CMD are supplied from the command generation circuit 23 via the penetrating electrodes TSV1.

Penetrating electrodes TSV are connection portions that electrically connect together terminals (at least two terminals) that each of laminated chips (at least two chips) has. The penetrating electrodes TSV may be referred to as electrodes, vias, penetrating vias, penetrating substrate electrodes, penetrating substrate vias, through substrate electrodes, through substrate vias, Through Substrate Vias, penetration electrodes, penetration vias, through-electrode, or through-vias.

A command generation circuit 23 is a circuit that decodes a command signal CMD input from a command terminal 12 to generate various internal commands (first internal commands). The same is true for a command generation circuit 44: The command generation circuit 44 has a function of generating various internal commands (second internal commands) by decoding a command signal CMD that is input from the command terminal 12 via the command generation circuit 23.

The command signals CMD include a read command, a write command, a MRS (Mode Register Set) command.

The configuration according to an embodiment of the invention for a reading operation will be described with reference to FIG. 7.

When the command signal CMD represents a read command, the command generation circuits 23 and 44 each generate internal read commands RD. The internal read command RD generated by the command generation circuit 23 is supplied, via a delay adjustment circuit 24 (first delay adjustment circuit), to a read control timing adjustment circuit 25 (first timing adjustment circuit) that is provided on the interface chip IF. The internal read command RD generated by the command generation circuit 44 is supplied to a read control timing adjustment circuit 45 that is in the same core chip.

The delay adjustment circuit 24 is a circuit that makes a delay adjustment to the timing of a signal output by the command generation circuit 23 on the basis of a delay code. A delay code adjustment circuit 31 is a circuit that supplies the delay code to the delay adjustment circuit 24; the delay code adjustment circuit 31 will be detailed in FIG. 11.

The read control timing adjustment circuit 25 is a circuit that generates various control signals (first control signals) in response to an internal read command RD supplied from the delay adjustment circuit 24. As shown in FIG. 7, the control signals generated by the read control timing adjustment circuit 25 include a control signal DRAOTSVOUT, a control signal DRWBSLTCH, and a control signal DRAOUT.

A control signal selector circuit 26 receives the control signals DRWBSLTCH and DRAOUT, out of the various control signals generated by the read control timing adjustment circuit 25. The control signals are respectively supplied by the control signal selector circuit 26 to a TSV buffer 20 and RWBUS buffer 21 in the interface chip IF.

The control signal DRAOTSVOUT is transmitted to a TSV selector circuit 47 in each of the core chips CC0 to CC3 via the control signal selector circuit 26 and the penetrating electrode TSV1. The control signal DRAOTSVOUT is supplied by the TSV selector circuit 47 to a TSV buffer 43.

The read control timing adjustment circuit 45 is a circuit that generates various control signals in response to an internal read command RD supplied from the command generation circuit 44. The control signals generated by the read control timing adjustment circuit 45 include a control signal DRAE, a control signal DRAO, and a control signal DRAOTSV.

A control signal selector circuit 46 receives the control signals DRAE, DRAO, and DRAOTSV generated by the read control timing adjustment circuit 45. The control signals are respectively supplied by the control signal selector circuit 46 to a main amplifier 40, a RWBUS buffer 41, and TSVFIFO 42 in the same core chip.

The signal DRAOTSV output by the control signal selector circuit 46 becomes a signal for a signal capturing and a signal outputting in the TSVFIFO 42. The signal DRAOTSVOUT output by the TSV selector circuit 47 becomes a signal for a signal capturing and a signal outputting in the TSV buffer 43. The above-described signal control process adjusts and optimizes the signal timing of the reading operation, which will be described later in detail.

The configuration according to an embodiment of the invention for a writing operation will be described with reference to FIG. 8.

The command generation circuits 23 and 44 each generate an internal write command WR when the command signal CMD represents a write command. The internal write command WR generated by the command generation circuit 23 is supplied to a write control timing adjustment circuit 54 that is provided on the interface chip IF. The internal write command WR generated by the command generation circuit 44 is supplied to a write control timing adjustment circuit 76 (second timing adjustment circuit) in the same core chip via a delay adjustment circuit 75 (second delay adjustment circuit).

The delay adjustment circuit 75 is a circuit that makes a delay adjustment to the timing of a signal output by the command generation circuit 44 on the basis of a delay code. A delay code adjustment circuit 61 is a circuit that supplies the delay code to the delay adjustment circuit 75; the delay code adjustment circuit 61 will be detailed in FIG. 17.

The write control timing adjustment circuit 54 is a circuit that generates various control signals in response to an internal write command WD supplied from the command generation circuit 23. The control signals generated by the write control timing adjustment circuit 54 include a control signal DWCLKDT, a control signal DWCLKTSV, and a control signal DWCLKTSVIN.

A control signal selector circuit 55 receives the control signals DWCLKDT and DWCLKTSV, out of the control signals generated by the write control timing adjustment circuit 54. The control signals are respectively supplied by the control signal selector circuit 55 to a RWBUS buffer 51 and TSV buffer 52 in the interface chip IF.

The control signal DWCLKTSVIN is transmitted to a TSV selector circuit 78 in each of the core chips CC0 to CC3 through the control signal selector circuit 55 and the penetrating electrode TSV1, and is supplied by the TSV selector circuit 78 to a TSVFIFO 70.

The write control timing adjustment circuit 76 is a circuit that generates various control signals (second control signals) in response to an internal write command WR supplied from the delay adjustment circuit 75. The control signals generated by the write control timing adjustment circuit 76 include a control signal DWCLKTSVOUT, a control signal DWCLK_CORE, and a control signal DWAE.

A control signal selector circuit 77 receives the control signals DWCLKTSVOUT, DWCLK_CORE, and DWAE generated by the write control timing adjustment circuit 76. The control signals are respectively supplied by the control signal selector circuit 77 to a TSV buffer 71, a RWBUS buffer 72, and a write amplifier 73 in the same core chip.

The signal DWCLKTSVIN output by the TSV selector circuit 78 becomes a signal for a signal capturing and a signal outputting in the TSVFIFO 70. The signal DWCLKTSVOUT output by the control signal selector circuit 77 becomes a signal for a signal capturing and a signal outputting in the TSV buffer 71. The above-described signal control process adjusts and optimizes the signal timing of the writing operation, which will be described later in detail.

As shown in FIGS. 7 and 8, a data input/output terminal 13 is a terminal used for the inputting and outputting of the read data DQ or write data DQ. Incidentally, FIGS. 7 and 8 only show one data input/output terminal 13. However, the actual semiconductor device 10 has a plurality of data input/output terminals 13; an output buffer 22, an input buffer 50, and any other circuits described later are provided for each of a plurality of the data input/output terminals 13.

As shown in FIG. 7, as for the read data DQ, the data input/output terminals 13 each are connected to the output buffer 22. The read data DQ that is read from a memory cell array 65 of each of the core chips CC0 to CC3 is supplied to the interface chip IF via a signal path that includes the penetrating electrode TSV1. Then, the read data DQ is output to the outside through the data input/output terminal 13 after passing through the output buffer 22. The operation timing of the output buffer 22 is controlled by a timing signal from a DQ output control circuit 27.

The read data DQ is supplied to the output buffer 22 from the RWBUS buffer 21 as four lines of parallel data. Each line contains four-bit data. The output buffer 22 converts the four-line parallel data into 16-bit serial data, and outputs eight bits at a time from the data input/output terminal 13 in burst mode.

As shown in FIG. 8, as for the write data DQ, the data input/output terminals 13 each are connected to the input buffer 50. The write data DQ input from the outside is supplied to the RWBUS buffer 51 via the input buffer 50, and is supplied to each of the core chips CC0 to CC3 via a signal path including the penetrating electrode TSV1. The operation timing of the input buffer 50 is controlled by a timing signal supplied from a DQ input control circuit 56.

Eight bits of the write data DQ are input at a time to each of a plurality of the data input/output terminals 13 in burst mode. Usually, the burst inputting is carried out twice in a row during one cycle. Therefore, to each data input/output terminal 13, in one cycle, the 16-bit write data DQ is supplied in a serial manner. The input buffer 50 converts the 16-bit data, which are supplied as described above, into four-line parallel data, and supplies the data to the RWBUS buffer 51.

According to an embodiment, what is provided is the first delay code generation circuit that outputs a different delay code signal depending on temperature measured by the first temperature sensor circuit. Therefore, it is possible to change the amount of delay by the delay adjustment circuit depending on temperature according to an embodiment. Accordingly, the reading and writing operation can be performed at an optimal signal timing in both a high-temperature operation and a low-temperature operation. As a result, it is possible to shorten at least either the write recovery time tWR or the address access time tAA according to an embodiment.

The reading and writing operation of the semiconductor device 10 will be described in detail with reference to a operation timing chart of each signal.

<Operation Timing of Each Signal for Reading Operation>

Figure 9:
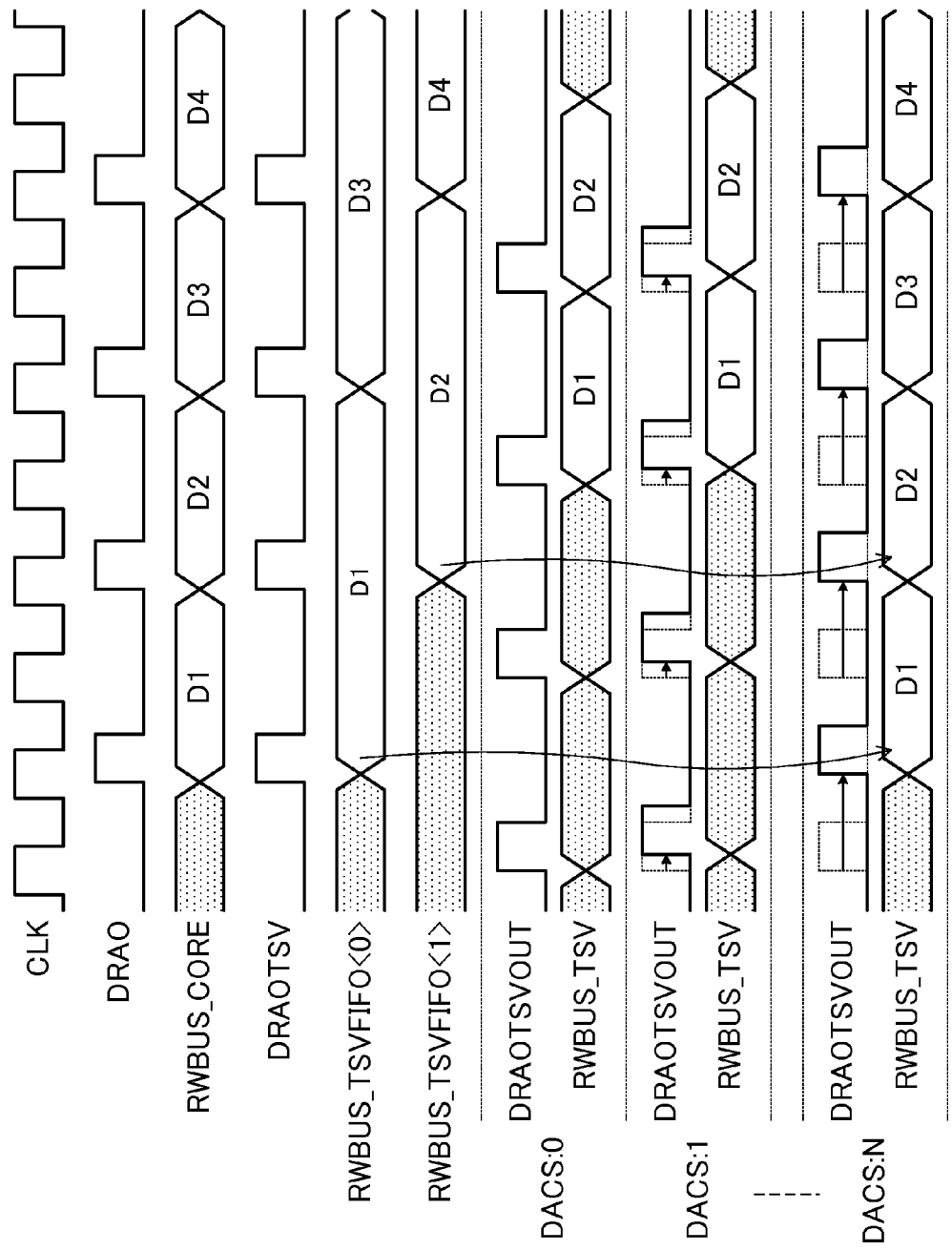
FIG. 9 is a diagram showing an operation timing of various signals pertaining to a reading operation according to an embodiment of the invention.

FIG. 9 is a diagram showing an operation timing of various signals for a reading operation according to an embodiment of the invention. With reference to FIGS. 7 and 9, the configuration of the semiconductor device 10 pertaining to the reading operation will be described in detail.

For the read operation, in the interface chip IF (first semiconductor chip), the TSV buffer 20, the RWBUS buffer 21, and the output buffer 22 are provided as shown in FIG. 7. In each of the core chips CC0 to CC3 (second semiconductor chips), the main amplifier 40, the RWBUS buffer 41, the TSVFIFO 42, and the TSV buffer 43 are provided. In each of the core chips CC0 to CC3, a sense amplifier circuit 64 and a memory cell array 65 are also provided.

The memory cell array 65 has a configuration in which a plurality of word lines WL and a plurality of bit lines BL that cross each other, and memory cells MC that are disposed at intersection points of the lines (In FIGS. 7 and 8, only one word line WL, one bit line BL, and one memory cell MC are shown). The word lines WL are selected by a row system control circuit (not shown) based on a row address supplied from the outside to the address terminal. The bit lines BL are connected to corresponding sense amplifiers in the sense amplifier circuit 64. The sense amplifiers are selected by a column system control circuit (not shown) based on a column address supplied from the outside to the address terminal.

The read data DQ that are read from the memory cell array 65 pass through the main amplifier 40 and the RWBUS buffer 41 before being supplied to the TSVFIFO 42. The operation timings of the main amplifier 40 and the RWBUS buffer 41 are controlled by control signals DRAE and DRAO, respectively.

Read data sets D1 to D4 shown in FIG. 9 are one line of the parallel data of four lines (16-bit read data DQ) read from the memory cell array 65. The data RWBUS_CORE shown in FIG. 9 are output data of the RWBUS buffer 41. As shown in FIG. 9, the read data sets D1 to D4 are output with a duration of two clocks in a serial manner from the RWBUS buffer 41.

The TSVFIFO 42 is so configured as to capture the data RWBUS_CORE output from the RWBUS buffer 41 at a time when the control signal DRAOTSV is activated. Incidentally, as described above, the control signal DRAOTSV is a control signal that the read control timing adjustment circuit 45 generates based on the internal read command RD supplied from the command generation circuit 44. As shown in FIG. 7, the TSVFIFO 42 includes two holding circuits 42a and 42b, which hold the captured data RWBUS_CORE in a parallel manner.

The holding circuit 42a is so configured as to capture the data RWBUS_CORE at timings when odd-numbered active sections of the control signal DRAOTSV whose active sections intermittently arrives is arriving. As a result, the holding circuit 42a sequentially holds the odd-numbered read data DQ (read data D1 and D3) among a plurality of read data DQ that are output in a serial manner from the RWBUS buffer 41.

On the other hand, the holding circuit 42b is so configured as to capture the data RWBUS_CORE at timings when even-numbered active sections of the control signal DRAOTSV whose active sections intermittently arrives is arriving. As a result, the holding circuit 42b sequentially holds the even-numbered read data DQ (read data D2 and D4) among a plurality of read data DQ that are output in a serial manner from the RWBUS buffer 41. The data RWBUS_TSVFIFO<0> and data RWBUS_TSVFIFO<1> shown in FIG. 9 are data held by the holding circuits 42a and 42b, respectively. As shown in FIG. 9, the holding circuits 42a and 42b each hold the corresponding data for a period of time worth four clocks.

The TSV buffer 43 is a circuit that sequentially takes out a plurality of read data DQ from the two holding circuits 42a and 42b, and outputs the read data DQ to a core chip side end portion of the penetrating electrode TSV1. The timing at which the TSV buffer 43 captures the data RWBUS_TSVFIFO<0> and the data RWBUS_TSVFIFO<1> is controlled by the control signal DRAOTSVOUT.

In this case, the control signal DRAOTSVOUT is a signal that is supplied from the interface chip IF, and represents a timing at which the read data DQ are captured by the interface chip IF. Meanwhile, the control signal DRAOTSV is generated inside the core chips. Therefore, the breakdown of synchronization is more likely to occur between the control signal DRAOTSV and the control signal DRAOTSVOUT than between the control signals that are generated in the same chip. To cope with the breakdown of synchronization, the semiconductor device 10 includes the TSVFIFO 42 and the delay adjustment circuit 24. The TSVFIFO 42 is a circuit that works for the case where the control signal DRAOTSVOUT lags behind the control signal DRAOTSV. Since the TSVFIFO 42 has the two holding circuits 42a and 42b, the TSVFIFO 42 is able to hold the read data DQ for a period of time (four clocks) that is twice as long as a conventional timing margin (two clocks). As a result, even if the control signal DRAOTSVOUT is delayed to a certain degree, the TSV buffer 43 can properly acquire the read data DQ. The delay adjustment circuit 24 is a circuit that works for the case where the control signal DRAOTSVOUT is ahead of the control signal DRAOTSV. The delay adjustment circuit 24 will be described later in detail.

The read data DQ that are output by the TSV buffer 43 to the core chip side end portion of the penetrating electrode TSV1 are captured by the TSV buffer 20. Then, the read data DQ pass through the RWBUS buffer 21 and the output buffer 22 before being output to the external memory controller 1 (FIG. 6) from the data input/output terminal 13. The operation timings of the TSV buffer 20 and the RWBUS buffer 21 are controlled by the control signals DRWBSLTCH and DRAOUT, respectively. Both the control signals DRWBSLTCH and DRAOUT are control signals generated by the read control timing adjustment circuit 25 inside the interface chip IF. Therefore, the control signals DRWBSLTCH and DRAOUT are properly in synchronization with the control signal DRAOTSVOUT. As a result, the TSV buffer 20 and the RWBUS buffer 21 properly can capture the read data DQ at any time.

The function of the delay adjustment circuit 24 shown in FIG. 7 will be described in detail.

The delay adjustment circuit 24 is a circuit that controls the timing at which the read control timing adjustment circuit 25 generates each control signal. This function is realized by delaying the timing at which the internal read command RD generated by the command generation circuit 23 is supplied to the read control timing adjustment circuit 25. The semiconductor device 10 includes the delay code adjustment circuit 31 associated with the delay adjustment circuit 24. The amount of delay of the internal read command RD in the delay adjustment circuit 24 is set based on a delay adjustment code signal DACS supplied from the delay code adjustment circuit 31. The delay adjustment code signal DACS will be detailed later.

The values of the delay adjustment code signal DACS shown in FIG. 9 indicate the amounts of delay of the internal read command RD in the delay adjustment circuit 24. FIG. 9 shows an example in which, when the delay adjustment code signal DACS is 0, the control signal DRAOTSVOUT has advanced ahead of the control signal DRAOTSV. In this example, the TSV buffer 43 has failed to capture the read data DQ; as the signal RWBUS_TSV that is an output signal of the TSV buffer 43, a previous cycle's output signal of the TSVFIFO 42 is set.

In the example of FIG. 9, if the delay adjustment code signal DACS is N, the TSV buffer 43 is able to properly capture the read data DQ. In this manner, if an appropriate value is set for the delay adjustment code signal DACS, the interface chip IF is able to properly capture the read data DQ even when the control signal DRAOTSVOUT has advanced ahead of the control signal DRAOTSV.

The delay adjustment code signal DACS for the reading operation will be described in detail with reference to FIG. 7.

In association with the delay adjustment code signal DACS pertaining to the reading operation, the interface chip IF includes, in addition to the above delay code adjustment circuit 31, a delay adjustment counter circuit 30, a determination margin adjustment circuit 32, an expectation value determination circuit 33. The delay code adjustment circuit 31 is so configured as to be able to store the delay adjustment code signal DACS in each of a situation where the temperature of the chip is high (or equal to or higher than a predetermined first temperature) and a situation where the temperature of the chip is low (or lower than the first temperature). The storing is realized by writing, to a fuse circuit included in the delay code adjustment circuit 31, a delay adjustment code signal DACS (or output signal DACH described later) for the situation where the temperature of the chip is high, and a delay adjustment code signal DACS (or output signal DACL described later) for the situation where the temperature of the chip is low. The delay code adjustment circuit 31 is so configured as to select one of the above signals depending on the temperature of the chip in operation, and output the selected one as a delay adjustment code signal DACS.

The writing of the delay adjustment code signal DACS to the fuse circuit included in the delay code adjustment circuit 31 is carried out based on results of attempts of the reading operation conducted in a production process. The determination margin adjustment circuit 32 and the expectation value determination circuit 33 are circuits to make the above writing process semi-automatic. More specifically, the determination margin adjustment circuit 32 and the expectation value determination circuit 33 are so configured as to make a determination as to whether or not the read data DQ has been properly captured by the interface chip IF during the attempts of the reading operation, and to output a determination signal JS indicating the results. The attempts of the reading operation are repeatedly carried out with varying delay adjustment code signals DACS in both the situation where the temperature of the chip is high and the situation where the temperature of the chip is low until the determination signal JS indicates an affirmative determination result (or that the read data DQ has been properly captured by the interface chip IF).

Figure 10:
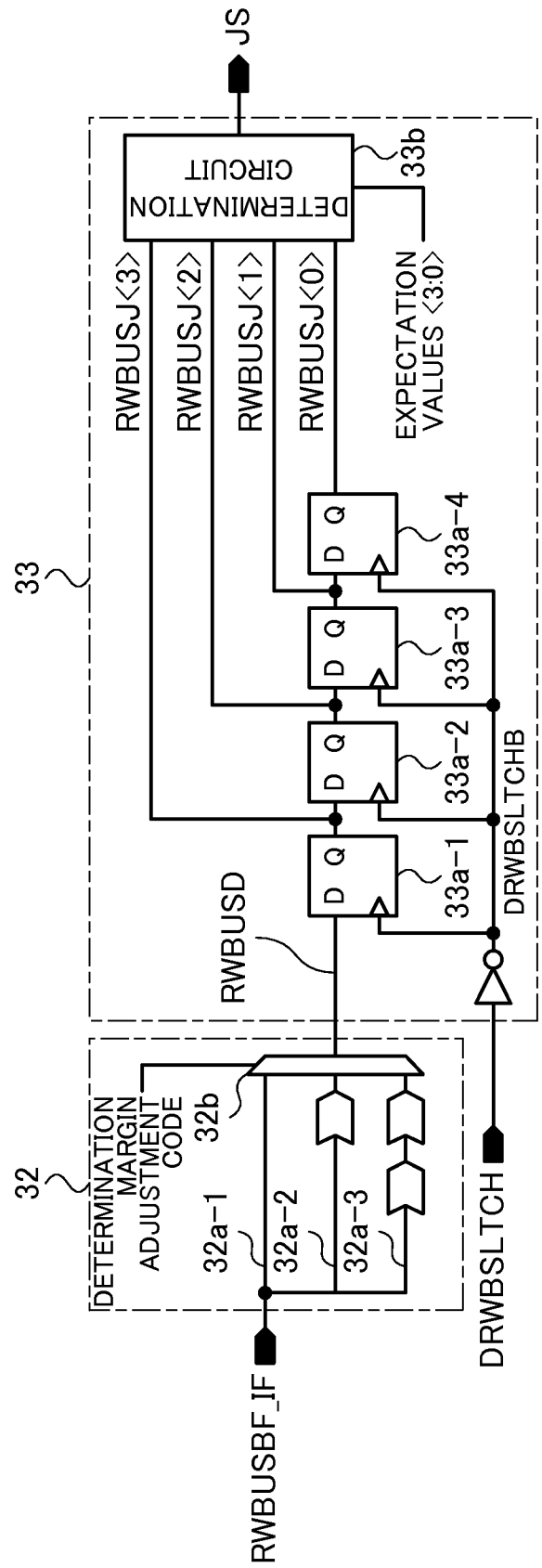
FIG. 10 is a diagram showing a determination margin adjustment circuit and an expectation value determination circuit according to an embodiment of the invention.

FIG. 10 is a diagram showing a determination margin adjustment circuit 32 and the expectation value determination circuit 33 shown in FIG. 7 according to an embodiment of the invention.

The determination margin adjustment circuit 32 is a circuit that delays data RWBUSBF_IF output from the TSV buffer 20 by a predetermined amount of delay and supplies the data to the expectation value determination circuit 33. As shown in the diagram, the determination margin adjustment circuit 32 includes a plurality of paths 32a-1 to 32a-3, which have different amounts of delay, and a selector 32b.

Data RWBUSBF_IF is supplied to input terminals of the paths 32a-1 to 32a-3. Output terminals of the 32a-1 to 32a-3 are connected to input terminals of the selector 32b. An output terminal of the selector 32b is an output terminal of the determination margin adjustment circuit 32.

A determination margin adjustment code is supplied from an external tester to the selector 32b. The determination margin adjustment code is a code used for selecting one of a plurality of the paths 32a-1 to 32a-3. The selector 32b connects a path selected based on the determination margin adjustment code to the output terminal of the determination margin adjustment circuit 32. An output signal of the determination margin adjustment circuit 32 is supplied to the expectation value determination circuit 33 as a signal RWBUSD.

In the expectation value determination circuit 33, an expectation value of the read data DQ (or a value of the read data DQ that is output from the TSV buffer 20 when the data is properly captured) is stored. The expectation value determination circuit 33 is a circuit that compares the expectation value with the data RWBUSBF_IF supplied from the determination margin adjustment circuit 32, and generates a determination signal JS based on the comparison results. More specifically, as shown in FIG. 10, the expectation value determination circuit 33 includes D-type flip-flops 33a-1 to 33a-4, which are connected in cascade, and a determination circuit 33b.

The D-type flip-flops 33a-1 to 33a-4 each include an input terminal D, an output terminal Q, and a clock terminal. The D-type flip-flops 33a-1 to 33a-4 are so configured as to start outputting, from the output terminal Q, a signal supplied to the input terminal D, at a timing at which a signal supplied to the clock terminal is activated.

An inversion signal DRWBSLTCHB of the control signal DRWBSLTCH is supplied to the clock terminals of the D-type flip-flops 33a-1 to 33a-4. The signal RWBUSD is supplied to the input terminal D of the first-stage D-type flip-flop 33a-1.

Output signals of the D-type flip-flops 33a-1 to 33a-4 are supplied to the determination circuit 33b as data RWBUSJ<3> to <0>. In this manner, the four-bit read data DQ, which are supplied in a serial manner as the signal RWBUSD, are converted into the four-bit parallel data RWBUSJ<3> to <0>, before being supplied to the determination circuit 33b.

The determination circuit 33b has a function of comparing the data RWBUSJ<3> to <0> with four-bit expectation values <3:0>, which are stored in the expectation value determination circuit 33 in advance. The determination circuit 33b outputs a determination signal JS indicating the comparison results.

As shown in FIG. 7, the expectation value determination circuit 33 (determination circuit 33b) outputs the determination signal JS to the delay adjustment counter circuit 30 and the delay code adjustment circuit 31. The delay adjustment counter circuit 30 shown in FIG. 7 is so configured as to add 1 to a counter value of the delay adjustment counter circuit 30 in response to the determination signal JS indicating a negative determination result. The delay code adjustment circuit 31 latches the counter value during the attempt of the reading operation, and outputs the counter value as a delay adjustment code signal DACS. As a result, as the number of times the attempt is repeatedly carried out increases, the rising timing of the control signal DRAOTSVOUT is delayed. Finally, at a time when the determination signal JS indicating an affirmative determination result is output, the attempt of the reading operation comes to an end; the counter value at that time is written to the fuse circuit included in the delay code adjustment circuit 31.

<Delay Code Adjustment Circuit 31 of a Reading Operation>

Figure 11:
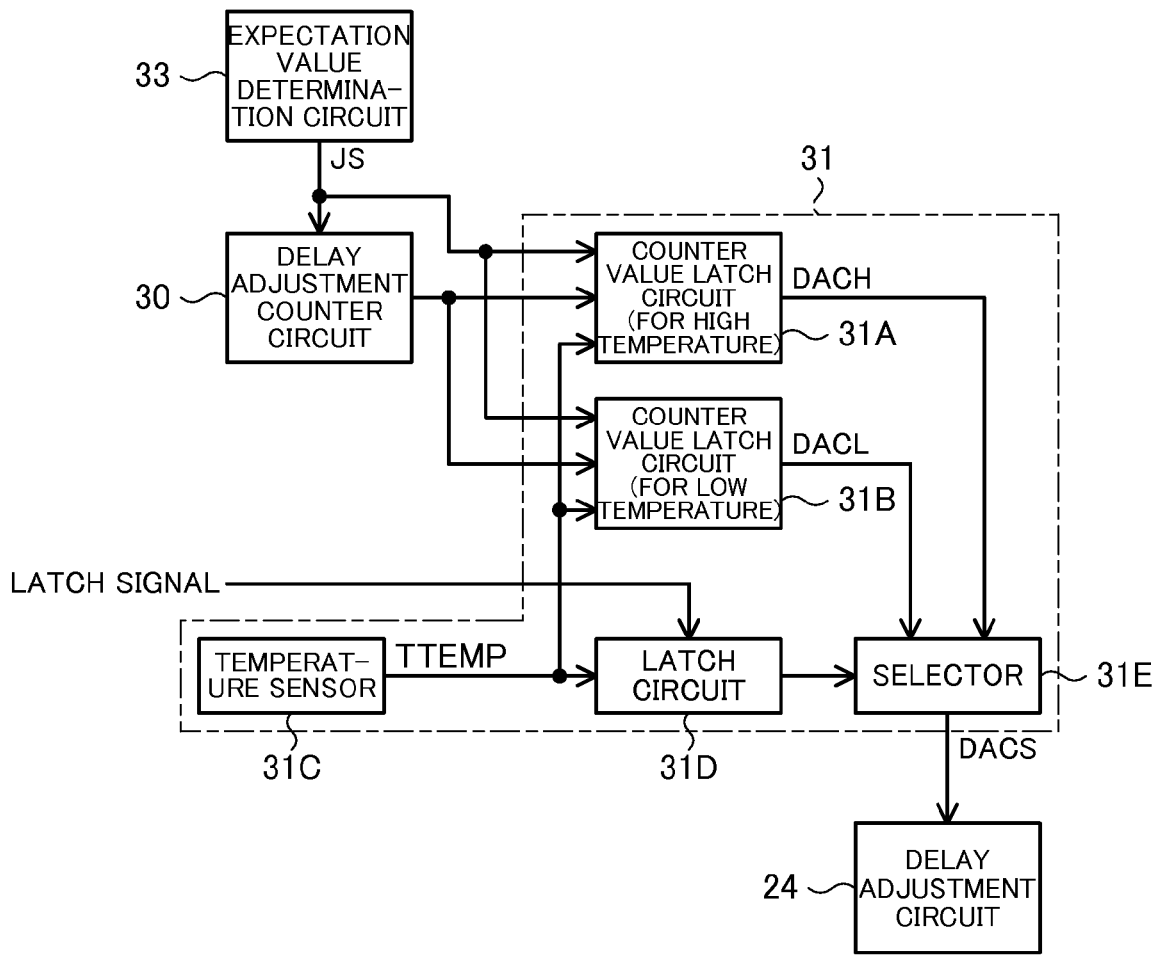
FIG. 11 is a block diagram showing a delay code adjustment circuit according to an embodiment of the invention.

FIG. 11 is a block diagram showing a delay code adjustment circuit 31 shown in FIG. 7 according to an embodiment of the invention. The delay code adjustment circuit 31 is used during the reading operation.

The delay code adjustment circuit 31 includes a counter value latch circuit 31A (first holding circuit), a counter value latch circuit 31B (second holding circuit), a temperature sensor 31C (first temperature sensor circuit), a latch circuit 31D, and a selector 31E (first delay code generation circuit).

The temperature sensor 31C is a circuit that is so configured as to change a potential level of an output signal TTEMP (first detection signal) depending on the temperature of the mounted chip. More specifically, the temperature sensor 31C changes the potential level of the output signal TTEMP to a first level when the temperature of the mounted chip is equal to or higher than a first temperature; the temperature sensor 31C changes the potential level of the output signal TTEMP to a second level when the temperature is lower than the first temperature. The first and second levels are different.

The counter value latch circuit 31A is a circuit that holds a count value representing an optimal amount of delay that is acquired during the tests of high-temperature reading operation. Instead of being the latch circuit, the counter value latch circuit 31A may be a counter circuit, a register circuit, a memory region, an anti-fuse circuit, a fuse circuit, or a combination of those components. The counter value latch circuit 31A may be appropriately modified, as understood by those ordinarily skilled in the art.

The counter value latch circuit 31B is a circuit that holds a count value representing an optimal amount of delay that is acquired during the tests of low-temperature reading operation. Instead of being the latch circuit, the counter value latch circuit 31B may be a counter circuit, a register circuit, a memory region, an anti-fuse circuit, a fuse circuit, or a combination of those components. The counter value latch circuit 31B may be appropriately modified, as understood by those ordinarily skilled in the art.

The selector 31E is a circuit that outputs, as a delay adjustment code signal DACS, either the counter value held by the latch circuit 31A (for high temperature) or the counter value held by the latch circuit 31B (for low temperature), based on the results of detection by a temperature sensor 31C, or based on whether the temperature is high or low.

According to the above configuration, the semiconductor device 10 can perform an optimal reading operation with an optimal signal timing signal in both a high-temperature reading operation and a low-temperature reading operation.

The details will be described below.

The counter value latch circuit 31A is a "high-temperature" circuit that is so configured as to operate when a potential level of an output signal TTEMP of the temperature sensor 31C is the first level, i.e. when the temperature of the chip is equal to or higher than the first temperature. In the initial state, the counter value latch circuit 31A is so configured as to latch the counter value of the delay adjustment counter circuit 30; an output signal DACH (first delay code signal) thereof becomes a signal representing the counter value of the delay adjustment counter circuit 30. Once the determination signal JS indicating an affirmative determination result is supplied, the counter value latch circuit 31A is so configured as to set, in the fuse circuit (not shown), the counter value that is latched at that time. The counter value that is set in the fuse circuit is later written to the fuse circuit by laser or the like; since then, the output signal DACH has become a signal indicating the value stored in the fuse circuit.

The counter value latch circuit 31B is a "low-temperature" circuit that is so configured as to operate when the potential level of the output signal TTEMP of the temperature sensor 31C is the second level, i.e. when the temperature of the chip is lower than the first temperature. In other respects, the counter value latch circuit 31B is the same as the counter value latch circuit 31A, and the detailed description thereof therefore is omitted. An output signal DACL (second delay code signal) of the counter value latch circuit 31B becomes a signal indicating the counter value of the delay adjustment counter circuit 30 in the initial state. After the counter value is written to the fuse circuit (not shown), the output signal DACL becomes a signal indicating the value stored in the fuse circuit.

The latch circuit 31D is a circuit that latches the output signal TTEMP of the temperature sensor 31C in response to a latch signal supplied from an external tester. The output signal TTEMP latched by the latch circuit 31D is supplied to the selector 31E. The reason why the latch circuit 31D is provided is to prevent the output signal TTEMP from being switched in the midst of the reading operation in a case where the temperature of the chip is near the first temperature or in any other case.

The selector 31E is a circuit that outputs, as a delay adjustment code signal DACS, either the output signal DACH of the counter value latch circuit 31A or the output signal DACL of the counter value latch circuit 31B, in response to the output signal TTEMP supplied from the latch circuit 31D. More specifically, the selector 31E is configured so as to output the output signal DACH as the delay adjustment code signal DACS when the potential level of the output signal TTEMP is equal to the first level, and to output the output signal DACL as the delay adjustment code signal DACS when if the potential level of the output signal TTEMP is equal to the second level. Accordingly, if the temperature of the chip is equal to or higher than the above first temperature, the delay adjustment code signal DACS becomes the output signal DACH; if the temperature of the chip is lower than the above first temperature, the delay adjustment code signal DACS becomes the output signal DACL. In this manner, the amount of delay by the delay adjustment circuit 24 can be changed depending on the temperature of the chip.

<Operation Timing of Various Signals Pertaining to Attempt of Reading Operation>

A flow of a process by the above circuits of setting the delay adjustment code signal DACS will be described with reference to an example of the operation timing of various signals pertaining to an attempt of the reading operation according to an embodiment of the invention.

Figure 12:
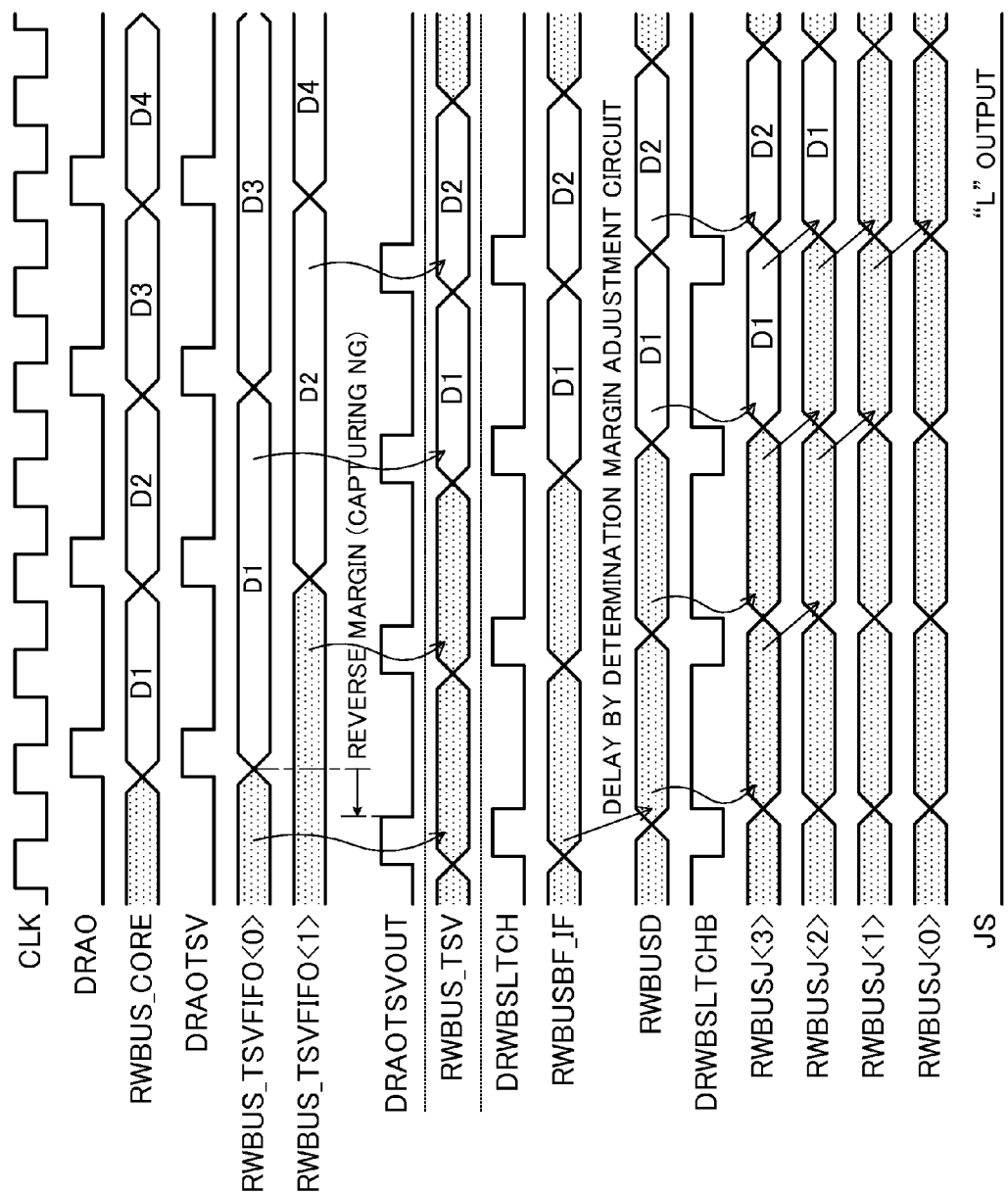
FIGS. 12, 13, and 14 are diagrams showing the operation timing of various signals pertaining to a reading operation according to an embodiment of the invention.
Figure 13:
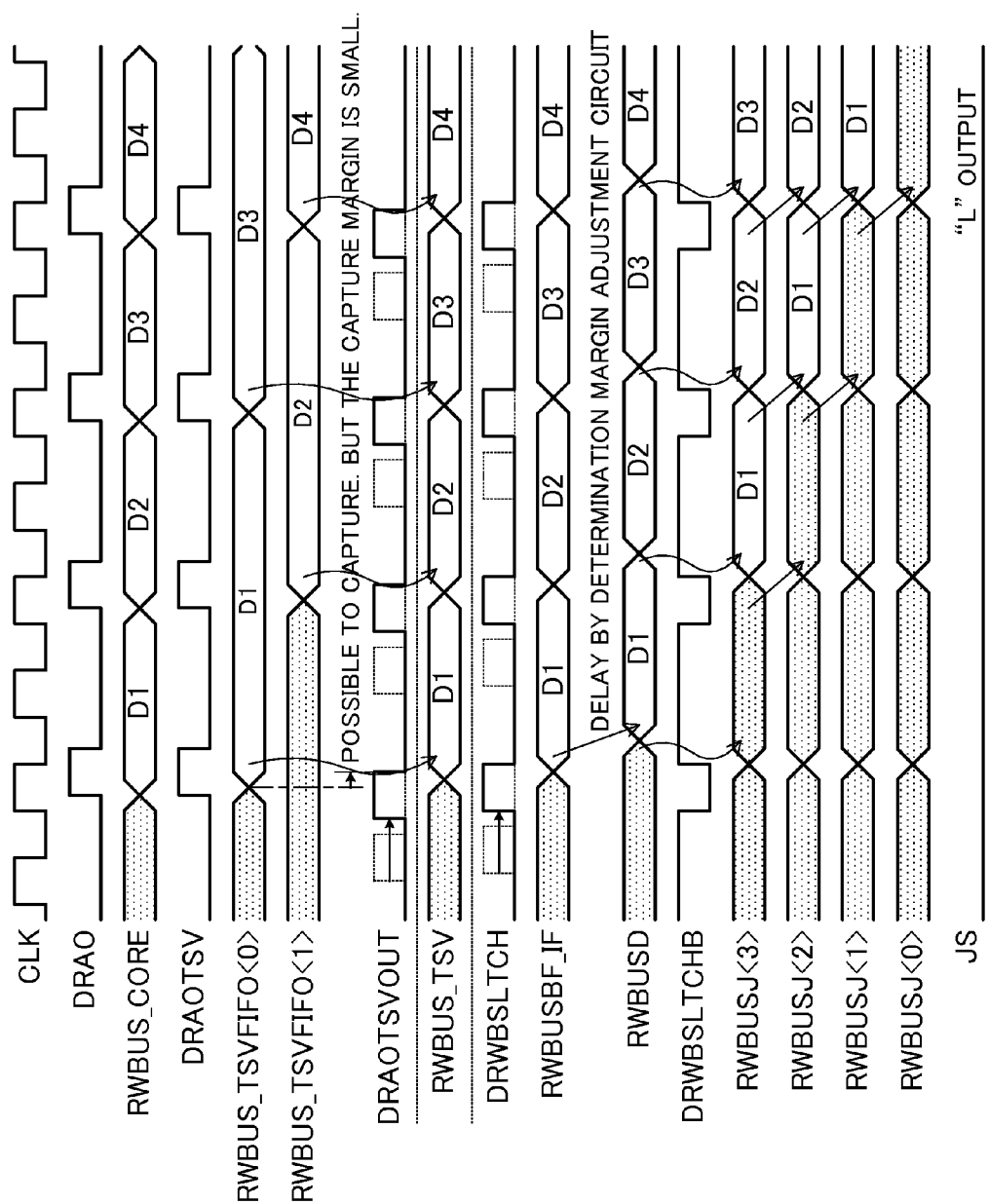
Figure 14:
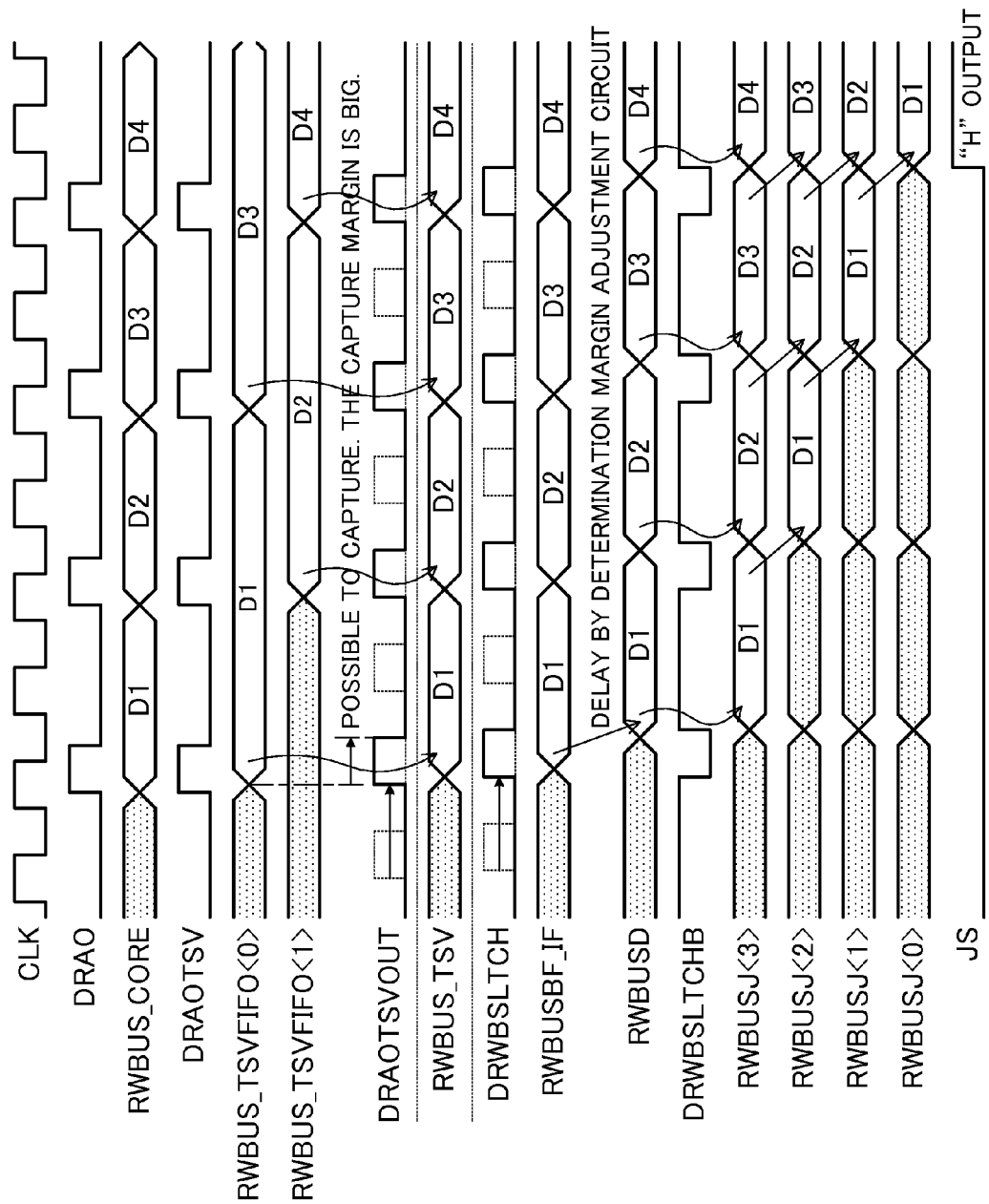

FIGS. 12, 13, and 14 are diagrams showing the operation timing of various signals pertaining to an attempt of the reading operation according to an embodiment of the invention. The signals leading up to the signal RWBUS_TSV are the same as those in FIG. 9. The following description therefore focuses on the portions different from those of FIG. 9.

As described above, in both a high-temperature state (with the temperature equal to or higher than the first temperature) and a low-temperature state (with the temperature lower than the first temperature), an attempt of the reading operation is repeatedly made by incrementing the delay adjustment code signal DACS until the TSV buffer 43 becomes able to capture the read data DQ without fail. The following description focuses on the high-temperature case, but the same is true of the low-temperature case.

FIG. 14 shows a situation where the setting process is completed, i.e. a situation where the TSV buffer 43 is able to capture the read data DQ without fail. As shown in the example, when the TSV buffer 43 is able to capture the read data DQ without fail, data sets D4 to D1 are set for data RWBUSJ<3> to <0> that are input into the determination circuit 33b (FIG. 7) in such a way as to correspond to the last active section of one cycle that is identified by four active sections of the control signal DRWBSLTCH. The expectation value determination circuit 33 compares the data RWBUSJ<3> to <0> at that time with the expectation value <3:0>. In the case of FIG. 14, the data RWBUSJ<3> to <0> and the expectation value <3:0> are equal. Therefore, the expectation value determination circuit 33 sets the logical value of the determination signal JS to "High", which indicates "match". As a result, the counter value of the delay adjustment counter circuit 30 at that time is written into the fuse circuit of the counter value latch circuit 31A, and the value of the output signal DACH is settled.

FIG. 12 shows an example of the first of a series of setting processes that are repeatedly performed. In the example, it can be understood from the data RWBUS_TSV shown in FIG. 12 that the TSV buffer 43 (FIG. 7) has failed to capture the read data DQ. The reason is because the control signal DRAOTSVOUT is ahead of the control signal DRAOTSV (or because of the reverse margin). As a result, the logical value of the determination signal JS is "Low," and the counter value of the delay adjustment counter circuit 30 is increased by one.

FIG. 13 shows an example in which the TSV buffer 43 becomes able to properly capture the read data DQ after several setting processes. However, in this case, the areas where the active periods of the control signal DRAOTSVOUT and the active sections of the output signal of the TSVFIFO 42 overlap with each other (or the capture margin of the read data DQ) are small. The possibility thus remains that the reverse margin could easily appear as the environment in which the semiconductor device 10 is used changes (or as the temperature, or the power-supply voltage supplied from the outside, changes). Therefore, the TSV buffer 43 may fail to capture the read data DQ. The semiconductor device 10 is configured to continue to make delay adjustments, that is, not to settle the output signal DACH in the above state. More specifically, the above process is performed by the determination margin adjustment circuit 32, which will be described below in detail.

As described above, the determination margin adjustment circuit 32 is a circuit that delays a timing at which the data RWBUSBF_IF are supplied to the expectation value determination circuit 33. Since the timing is delayed, the read data DQ is slightly behind the inverted signal DRWBSLTCHB in entering the expectation value determination circuit 33, as indicated by the signal RWBUSD of FIG. 13. As a result, in the example of FIG. 13, at the first activation timing of the inverted signal DRWBSLTCHB, the data set D1 is not captured in the data RWBUSJ<3>. Finally, the logical value of the determination signal JS is "Low." Therefore, the output signal DACH remains unsettled, and the counter value of the delay adjustment counter circuit is increased by one. After that, the setting process continues until the situation shown in FIG. 14 arises.

As described above, the semiconductor device 10 of the present embodiment can change the amount of delay by the delay adjustment circuit 24 depending on the temperature of the chip. Accordingly, compared with an example in which the amount of delay by the delay adjustment circuit 24 is fixed regardless of the temperature, it is possible to reduce the difference (time lag) between the timing at which the read data DQ is captured by the TSVFIFO 42 and the timing at which the TSV buffer 43 captures the read data DQ from the TSVFIFO 42. As a result, the address access time tAA can be shortened.

<Operation Timing of Various Signals Pertaining to a Writing Operation>

Figure 15:
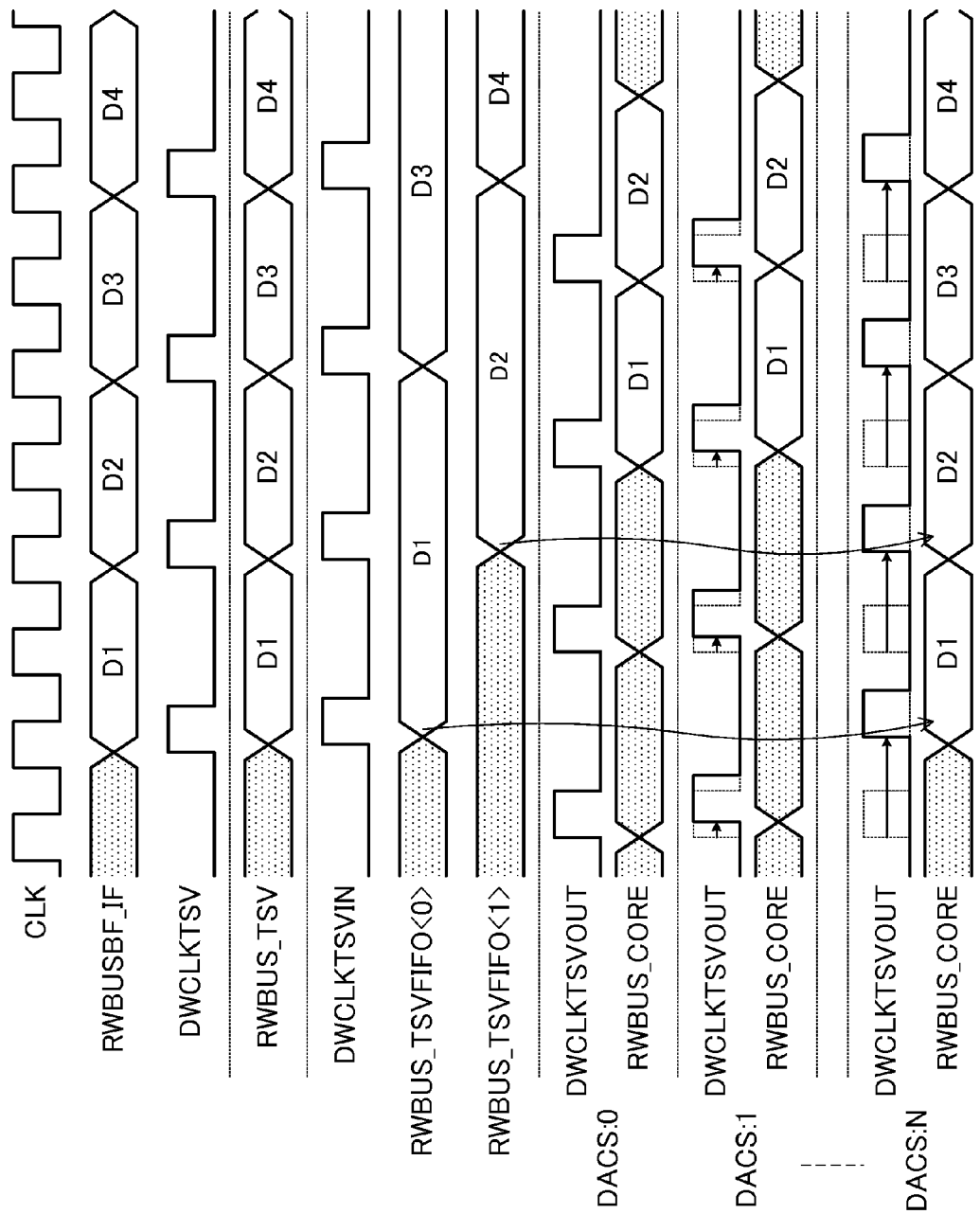
FIG. 15 is a diagram showing the operation timing of various signals pertaining to a writing operation according to an embodiment of the invention.

FIG. 15 is a diagram showing the operation timing of various signals pertaining to a writing operation according to an embodiment of the invention. Hereinafter, with reference to FIGS. 8 and 15, the configuration of the semiconductor device 10 pertaining to the writing operation will be described in detail.

For the write operation, in the interface chip IF, the input buffer 50, the RWBUS buffer 51, and the TSV buffer 52 are provided as shown in FIG. 8. In each of the core chips CC0 to CC3, the TSVFIFO 70, the TSV buffer 71, the RWBUS buffer 72, and the write amplifier 73 are provided.

The write data DQ that are input from the data input/output terminal 13 pass through the input buffer 50, the RWBUS buffer 51, and the TSV buffer 52 before being supplied to an interface chip side end portion of the penetrating electrode TSV1. During the process, the input buffer 50, the RWBUS buffer 51, and the TSV buffer 52 each temporarily hold the write data DQ. The operation timings of the RWBUS buffer 51 and the TSV buffer 52 are controlled by the control signals DWCLKDT and DWCLKTSV, respectively.

The write data sets D1 to D4 shown in FIG. 15 are one line of the parallel data of four lines (16-bit write data DQ) output from the input buffer 50 (FIG. 8). The data RWBUSBF_IF and data RWBUS_TSV shown in FIG. 15 are output data of the RWBUS buffer 51 and the TSV buffer 52, respectively. As shown in FIG. 15, the write data sets D1 to D4 are output with a duration of two clocks in a serial manner from the RWBUS buffer 51.

The TSV buffer 52 is so configured as to capture the data RVBUSBF_IF at a time when the control signal DWCLKTSV is activated, and then output the captured data RVBUSBF_IF to the penetrating electrode TSV1 until the next time the control signal DWCLKTSV becomes activated (Data RWBUS_TSV). As shown in FIG. 15, the control signal DWCLKTSV is so controlled as to be activated at intervals of two clocks. Therefore, the TSV buffer 52 sequentially captures the write data sets D1 to D4, and sequentially outputs the write data sets D1 to D4 to the penetrating electrode TSV1 with a duration of two clocks.

The TSVFIFO 70 is connected to the penetrating electrode TSV1. The TSVFIFO 70 is so configured as to capture the data RWBUS_TSV that appears at the core chip side end portion of the penetrating electrode TSV1 at a time when the control signal DWCLKTSVIN (third control signal) is activated. Incidentally, as described above, the control signal DWCLKTSVIN is a control signal that the write control timing adjustment circuit 54 generates based on the internal write command WR supplied from the command generation circuit 23. As shown in FIG. 8, the TSVFIFO 70 includes the two holding circuits 70*a* and 70*b*, which hold the captured data RWBUS_TSV in a parallel manner.

The functionality of the holding circuits 70*a* and 70*b* are the same as that of the above-described holding circuits 42*a* and 42*b*. That is, the holding circuit 70*a* is so configured as to capture the data RWBUS_TSV at timings when odd-numbered active sections of the control signal DWCLKTSVIN whose active sections intermittently arrives is arriving. As a result, the holding circuit 70*a* sequentially holds the odd-numbered write data DQ (write data D1 and D3) among a plurality of write data DQ that are supplied in a serial manner from the interface chip IF. The holding circuit 70*b* is so configured as to capture the data RWBUS_TSV at a time when even-numbered active sections of control the signal DWCLKTSVIN whose active sections intermittently arrives is arriving. As a result, the holding circuit 70*b* sequentially holds the even-numbered write data DQ (write data D2 and D4) among a plurality of write data DQ that are supplied in a serial manner from the interface chip IF. The data RWBUS_TSVFIFO<0> and data RWBUS_TSVFIFO<1> shown in FIG. 15 are data held by the holding circuits 70*a* and 70*b*, respectively. As shown in FIG. 15, the holding circuits 70*a* and 70*b* each hold the corresponding data for a period of time worth four clocks.

Incidentally, the control signal DWCLKTSVIN is a control signal generated by the write control timing adjustment circuit 54 in the interface chip IF. Therefore, the control signal DWCLKTSVIN is properly in synchronization with the control signal DWCLKTSV and the control signal DWCLKTSVIN. As a result, the TSVFIFO 70 properly can acquire the write data DQ at any time.

The TSV buffer 71 is a circuit that sequentially takes out a plurality of write data DQ from the two holding circuits 70*a* and 70*b*, and outputs the write data DQ to the memory cell array 65 via the RWBUS buffer 72, the write amplifier 73, and the sense amplifier circuit 64. The timings at which the TSV buffer 71 captures the data RWBUS_TSVFIFO<0> and the data RWBUS_TSVFIFO<1> are controlled by the control signal DWCLKTSVOUT.

The control signal DWCLKTSVOUT is a signal that is generated in the core chips, and represents a timing at which the core chips capture the write data DQ. Meanwhile, the control signal DWCLKTSVIN is generated inside the interface chip IF. Therefore, the breakdown of synchronization is more likely to occur between the control signal DWCLKTSVIN and the control signal DWCLKTSVOUT than between the control signals that are generated in the same chip. This relation is the same as the above-described relation between the control signal DRAOTSV and the control signal DRAOTSVOUT. The following circuits are provided to cope with the breakdown of synchronization during the write operation: the TSVFIFO 70 and the delay adjustment circuit 75. The TSVFIFO 70 is a circuit that works for the case where the control signal DWCLKTSVOUT lags behind the control signal DWCLKTSVIN. Since the TSVFIFO 70 is provided, as in the case of the read operation, even if the control signal DWCLKTSVOUT is delayed to a certain degree, the TSV buffer 71 can properly acquire the write data DQ. The delay adjustment circuit 75 is a circuit that works for the case where the control signal DWCLKTSVOUT is ahead of the control signal DWCLKTSVIN. The delay adjustment circuit 75 will be described later in detail.

The advantageous effects brought about by the use of the TSVFIFO 70 will be described in more detail. Incidentally, the following description is similarly applied to the TSVFIFO 42 pertaining to the read operation.

If no TSVFIFO 70 is provided, the TSV buffer 71 can no longer properly capture the write data DQ at a time when the synchronization between the control signal DWCLKTSVOUT and the control signal DWCLKTSVIN breaks down and the difference therebetween exceeds two clocks. The reason is that the duration of the write data DQ that are output from the interface chip IF to the core chips is equal to two clocks as indicated by the data RWBUS_TSV in FIG. 15. If the allowable range for synchronization breakdown is referred to as a timing margin, the timing margin is equal to two clocks if no TSVFIFO 70 is provided. On the other hand, in the semiconductor device 10, the TSVFIFO 70 having the two holding circuits 70a and 70b is provided. Therefore, the timing margin is so extended as to be equal to four clocks.

The data RWBUS_CORE shown in FIG. 15 is data output from the TSV buffer 71. As shown in FIG. 15, the control signal DWCLKTSVOUT is controlled by the write control timing adjustment circuit 76 in such a way that the control signal DWCLKTSVOUT is alternately activated and inactivated at intervals of two clocks. The TSV buffer 71 is so configured as to capture the data RWBUS_TSVFIFO<0> (or data that are held by the holding circuit 70a) for an odd-numbered section, out of the active sections of the control signal DWCLKTSVOUT that is controlled as described above; and to capture the data RWBUS_TSVFIFO<0> (or data that are held by the holding circuit 70b) for an even-numbered section. As a result, as shown in FIG. 15, the TSV buffer 71 sequentially captures the write data D1 to D4, and outputs the write data D1 to D4 to the subsequent RWBUS buffer 72 with a width of two clocks.

As described above, each of the holding circuits 70a and 70b holds the corresponding data for a period of time worth four clocks. Accordingly, as shown in FIG. 15, even if the synchronization between the control signal DWCLKTSVOUT and the control signal DWCLKTSV breaks down, and the difference therebetween becomes greater than or equal to two clocks, the correct write data DQ are held by the holding circuits 70a and 70b at a time when the TSV buffer 71 is about to capture the write data DQ as long as the difference is less than or equal to four clocks. Therefore, the TSV buffer 71 can properly capture the write data DQ.

In that manner, on the core chips, the two holding circuits 70a and 70b are provided. Therefore, at the entrance of the core chips, the write data DQ can be held for a longer period of time (four clocks) than the duration (two clocks) of the write data that are output from the interface chip IF to the core chips. Accordingly, the timing margin, or the allowable range for synchronization breakdown between the control signal DWCLKTSV and the control signal DWCLKTSVOUT, can be extended so as to be equal to four clocks.

The write data DQ that are output from the TSV buffer 71 pass through the RWBUS buffer 72, the write amplifier 73, and the sense amplifier circuit 64 before being written into memory cells inside the memory cell array 65. The operation timings of the RWBUS buffer 72 and the write amplifier 73 are controlled by the control signals DWCLK_CORE and DWAE, respectively. Both the control signals DWCLK_CORE and DWAE are control signals generated by the write control timing adjustment circuit 76 inside the core chips. Therefore, the control signals DWCLK_CORE and DWAE are properly in synchronization with the control signal DWCLKTSVOUT. Thus, the RWBUS buffer 72 and the write amplifier 73 can properly acquire the write data DQ at any time.

The following describes the functionality of the delay adjustment circuit 75 in detail.

The delay adjustment circuit 75 is a circuit that controls a timing at which the write control timing adjustment circuit 76 generates each control signal. This functionality is realized by delaying a timing at which the internal write command WR generated by the command generation circuit 44 is supplied to the write control timing adjustment circuit 76. The semiconductor device 10 includes a delay code adjustment circuit 61, which are associated with the delay adjustment circuit 75. An amount of delay of the internal write command WR in the delay adjustment circuit 75 is set by the delay adjustment code signal DACS which is supplied (transmitted) from the delay code adjustment circuit 61 provided in the interface chip IF via the penetrating electrodes TSV1 (first electrode) provided on the interface chip IF. The delay adjustment code signal DACS will be detailed later.

The values of the delay adjustment code signal DACS shown in FIG. 15 indicate the amounts of delay of the internal write command WR in the delay adjustment circuit 75. FIG. 15 shows an example in which, when the delay adjustment code signal DACS is 0, the control signal DWCLKTSVOUT has advanced ahead of the control signal DWCLKTSVIN. In this example, the TSV buffer 71 has failed to capture the write data DQ; as the signal RWBUS_CORE that is an output signal of the TSV buffer 71, a previous cycle's output signal of the TSVFIFO 70 is set.

In the example of FIG. 15, if the delay adjustment code signal DACS is N, the TSV buffer 71 is able to properly capture the write data DQ. In this manner, if an appropriate value is set for the delay adjustment code signal DACS, each of the core chips CC0 to CC3 is able to properly capture the write data DQ even when the control signal DWCLKTSVOUT has advanced ahead of the control signal DWCLKTSVIN.

The delay adjustment code signal DACS for the writing operation will be described in detail with reference to FIG. 8.

In association with the delay adjustment code signal DACS pertaining to the writing operation, the semiconductor device 10 includes, in addition to the above-described delay code adjustment circuit 61, a delay adjustment counter circuit 60, a determination margin adjustment circuit 62, and an expectation value determination circuit 63. Among the above circuits, the delay adjustment counter circuit 60 and the delay code adjustment circuit 61 are provided inside the interface chip IF. The determination margin adjustment circuit 62 and the expectation value determination circuit 63 are provided in each of the core chips CC0 to CC3.

The function and operation of each of the above circuits are basically the same as the operation of the delay adjustment counter circuit 30, delay code adjustment circuit 31, determination margin adjustment circuit 32, and expectation value determination circuit 33 for the reading operation. The circuits will be described in detail below.

The delay code adjustment circuit 61 is so configured as to be able to store the delay adjustment code signal DACS in a situation where the temperature of the chip is high (or equal to or higher than a predetermined second temperature) and in a situation where the temperature of the chip is low (or lower than the second temperature). Incidentally, the second temperature may be equal to, or different from, the previously described first temperature. The storing is realized by writing, to a fuse circuit included in the delay code adjustment circuit 61, a delay adjustment code signal DACS (or output signal DACH described later) for the situation where the temperature of the chip is high, and a delay adjustment code signal DACS (or output signal DACL described later) for the situation where the temperature of the chip is low. The delay code adjustment circuit 61 is so configured as to select one of the above signals depending on the temperature of the chip in operation, and output the selected one as a delay adjustment code signal DACS.

The writing of the delay adjustment code signal DACS to the fuse circuit included in the delay code adjustment circuit 61 is carried out based on results of attempts of the writing operation conducted in a production process. The determination margin adjustment circuit 62 and the expectation value determination circuit 63 are circuits to make the above writing process semi-automatic. More specifically, the determination margin adjustment circuit 62 and the expectation value determination circuit 63 are so configured as to make a determination as to whether or not the write data DQ has been properly captured by a corresponding core chip during the attempts of the writing operation, and to output a determination signal JS indicating the results. The attempts of the writing operation are repeatedly carried out with varying delay adjustment code signals DACS in both the situation where the temperature of the chip is high and the situation where the temperature of the chip is low until the determination signal JS indicates an affirmative determination result (or that the write data DQ has been properly captured by the corresponding core chip).

Figure 16:
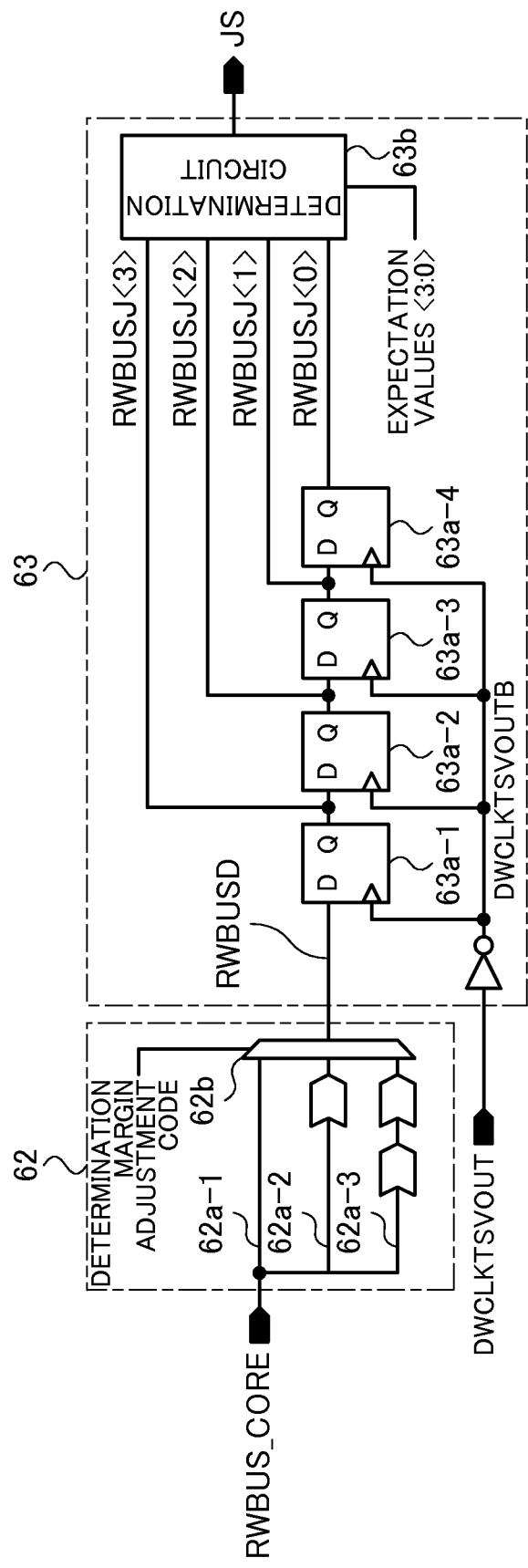
FIG. 16 is a diagram showing a determination margin adjustment circuit and an expectation value determination circuit according to an embodiment of the invention.

FIG. 16 is a diagram showing a determination margin adjustment circuit 62 and the expectation value determination circuit 63 shown in FIG. 8 according to an embodiment of the invention.

The determination margin adjustment circuit 62 includes a plurality of paths 62a-1 to 62a-3, which have different amounts of delay, and a selector 62b. The signal RWBUS_CORE is supplied to input terminals of the paths 62a-1 to 62a-3.

The expectation value determination circuit 63 is so configured as to include D-type flip-flops 63a-1 to 63a-4, which are connected in cascade; and a determination circuit 63b.

An inverted signal DWCLKTSVOUTB of the control signal DWCLKTSVOUT is supplied to a clock terminal of each of the D-type flip-flops 63a-1 to 63a-4.

It can be understood from a comparison between FIG. 10 (a configuration for the reading operation) and FIG. 16 (a configuration for the writing operation) that the internal configurations of the determination margin adjustment circuit 62 and expectation value determination circuit 63 are the same as those of the determination margin adjustment circuit 32 and expectation value determination circuit 33. Accordingly, the processes of the determination margin adjustment circuit 62 and expectation value determination circuit 63 are the same as those of the determination margin adjustment circuit 32 and expectation value determination circuit 33. Therefore, the processes will not be detailed again.

The delay adjustment counter circuit 60 shown in FIG. 8 is so configured as to add 1 to a counter value of the delay adjustment counter circuit 60 in response to the determination signal JS indicating a negative determination result. The delay code adjustment circuit 61 latches the counter value during the attempt of the writing operation, and outputs the counter value as a delay adjustment code signal DACS. As a result, as the number of times the attempt is repeatedly carried out increases, the rising timing of the control signal DWCLKTSVOUT is delayed. Finally, at a time when the determination signal JS indicating an affirmative determination result is output, the attempt of the writing operation comes to an end; the counter value at that time is written to the fuse circuit included in the delay code adjustment circuit 61.

<Delay Code Adjustment Circuit 61 of a Writing Operation>

Figure 17:
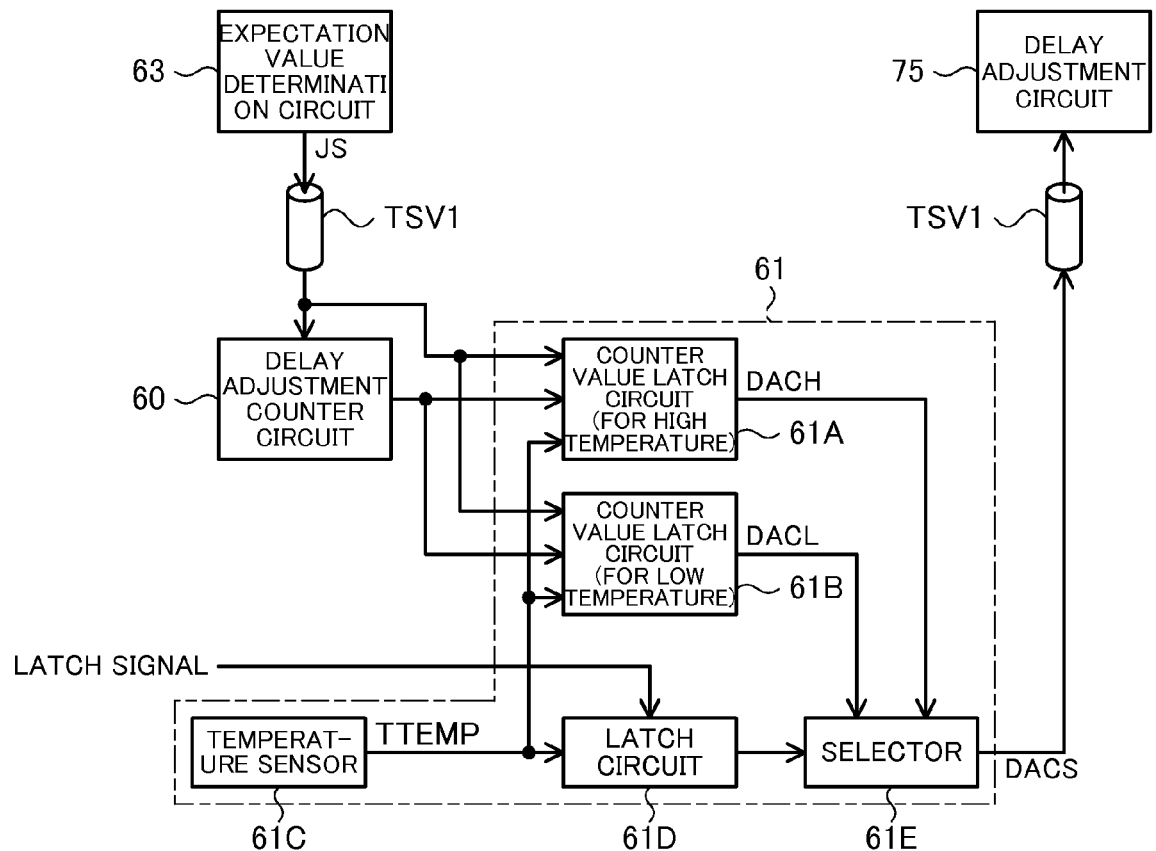
FIG. 17 is a block diagram showing a delay code adjustment circuit according to an embodiment of the invention.

FIG. 17 is a block diagram showing a delay code adjustment circuit 61 shown in FIG. 8 according to an embodiment of the invention. The delay code adjustment circuit 61 is used during the writing operation.

The delay code adjustment circuit 61 includes counter value latch circuits 61A and 61B, a temperature sensor 61C (second temperature sensor circuit), a latch circuit 61D, and a selector 61E (second delay code generation circuit).

The temperature sensor 61C is a circuit that is so configured as to change a potential level of an output signal TTEMP (second detection signal) depending on the temperature of the mounted chip. More specifically, the temperature sensor 61C changes the potential level of the output signal TTEMP to a third level when the temperature of the mounted chip is equal to or higher than a second temperature; the temperature sensor 61C changes the potential level of the output signal TTEMP to a fourth level when the temperature is lower than the second temperature. Incidentally, the third level may be equal to the above first level, and the fourth level may be equal to the above second level.

The counter value latch circuit 61A is a circuit that holds a count value representing an optimal amount of delay that is acquired during the tests of high-temperature writing operation. Instead of being the latch circuit, the counter value latch circuit 61A may be a counter circuit, a register circuit, a memory region, an anti-fuse circuit, a fuse circuit, or a combination of those components. The counter value latch circuit 61A may be appropriately modified, as understood by those ordinarily skilled in the art.

The counter value latch circuit 61B is a circuit that holds a count value representing an optimal amount of delay that is acquired during the tests of low-temperature writing operation. Instead of being the latch circuit, the counter value latch circuit 61B may be a counter circuit, a register circuit, a memory region, an anti-fuse circuit, a fuse circuit, or a combination of those components. The counter value latch circuit 61B may be appropriately modified, as understood by those ordinarily skilled in the art.

The selector 61E is a circuit that outputs, as a delay adjustment code signal DACS, either the counter value held by the latch circuit 61A (for high temperature) or the counter value held by the latch circuit 61B (for low temperature), based on the results of detection by the temperature sensor 61C, or based on whether the temperature is high or low. Accordingly, the semiconductor device 10 can perform an optimal writing operation at an optimal signal timing in both a high-temperature writing operation and a low-temperature writing operation.

The details will be described below.

The counter value latch circuit 61A is a "high-temperature" circuit that is so configured as to operate when a potential level of an output signal TTEMP of the temperature sensor 61C is the third level, i.e. when the temperature of the chip is equal to or higher than the second temperature. In the initial state, the counter value latch circuit 61A is so configured as to latch the counter value of the delay adjustment counter circuit 60; an output signal DACH (third delay code signal) thereof becomes a signal representing the counter value of the delay adjustment counter circuit 60. Once the determination signal JS indicating an affirmative determination result is supplied, the counter value latch circuit 61A is so configured as to set, in the fuse circuit (not shown), the counter value that is latched at that time. The counter value that is set in the fuse circuit is later written to the fuse circuit by laser or the like; since then, the output signal DACH has become a signal indicating the value stored in the fuse circuit.

The counter value latch circuit 61B is a "low-temperature" circuit that is so configured as to operate when the potential level of the output signal TTEMP of the temperature sensor 61C is the fourth level, i.e. when the temperature of the chip is lower than the second temperature. In other respects, the counter value latch circuit 61B is the same as the counter value latch circuit 61A, and the detailed description thereof therefore is omitted. An output signal DACL (fourth delay code signal) of the counter value latch circuit 61B becomes a signal indicating the counter value of the delay adjustment counter circuit 60 in the initial state. After the counter value is written to the fuse circuit (not shown), the output signal DACL becomes a signal indicating the value stored in the fuse circuit.

The latch circuit 61D is a circuit that latches the output signal TTEMP of the temperature sensor 61C in response to a latch signal supplied from an external tester. The output signal TTEMP latched by the latch circuit 61D is supplied to the selector 61E. The reason why the latch circuit 61D is provided is the same as that for the latch circuit 31D. That is, the latch circuit 61D is provided to prevent the output signal TTEMP from being switched in the midst of the writing operation in a case where the temperature of the chip is near the second temperature or in any other case.

The selector 61E is a circuit that outputs, as a delay adjustment code signal DACS, either the output signal DACH of the counter value latch circuit 61A or the output signal DACL of the counter value latch circuit 61B, in response to the output signal TTEMP supplied from the latch circuit 61D. More specifically, the selector 61E is configured so as to output the output signal DACH as the delay adjustment code signal DACS when the potential level of the output signal TTEMP is equal to the third level, and to output the output signal DACL as the delay adjustment code signal DACS when the potential level of the output signal TTEMP is equal to the fourth level. Accordingly, if the temperature of the chip is equal to or higher than the above second temperature, the delay adjustment code signal DACS becomes the output signal DACH; if the temperature of the chip is lower than the above second temperature, the delay adjustment code signal DACS becomes the output signal DACL. In this manner, the amount of delay by the delay adjustment circuit 75 can be changed depending on the temperature of the chip.

<Operation Timing of Various Signals Pertaining to Attempt of Writing Operation>

A flow of a process by the above circuits of setting the delay adjustment code signal DACS will be described with reference to an example of the operation timing of various signals pertaining to an attempt of the writing operation according to an embodiment of the invention.

Figure 18:
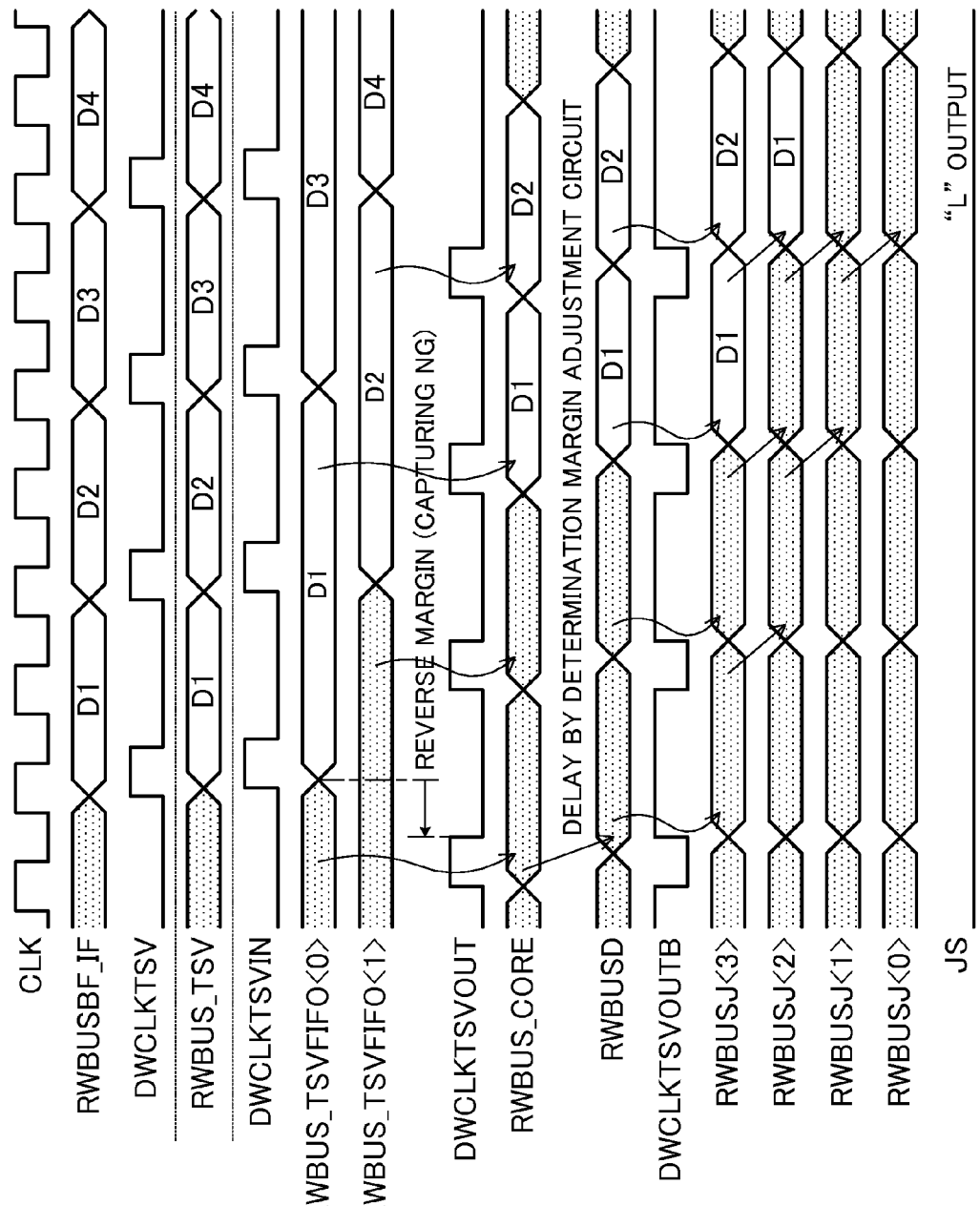
FIGS. 18, 19, and 20 are diagrams showing the operation timing of various signals pertaining to a writing operation according to an embodiment of the invention.
Figure 19:
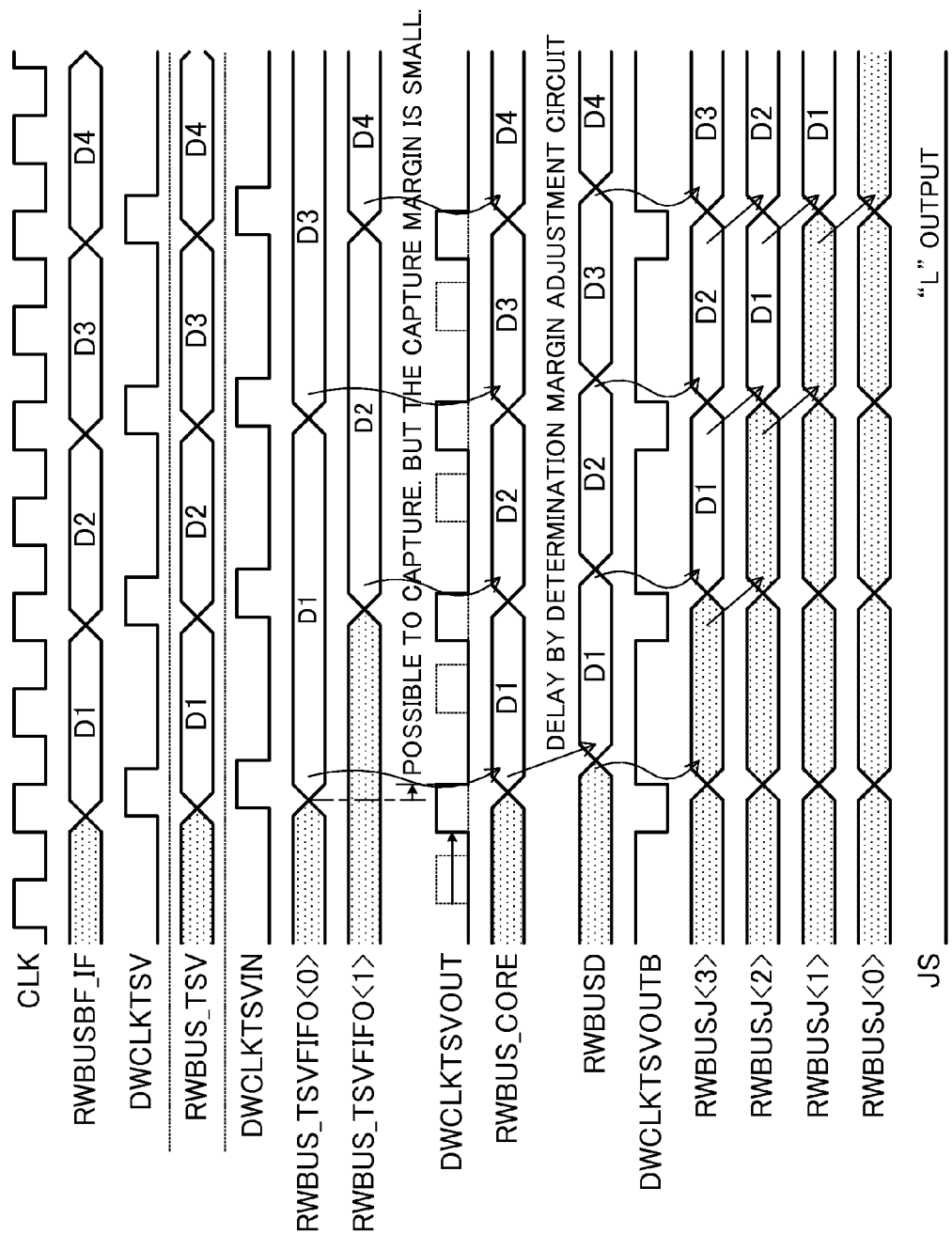
Figure 20:
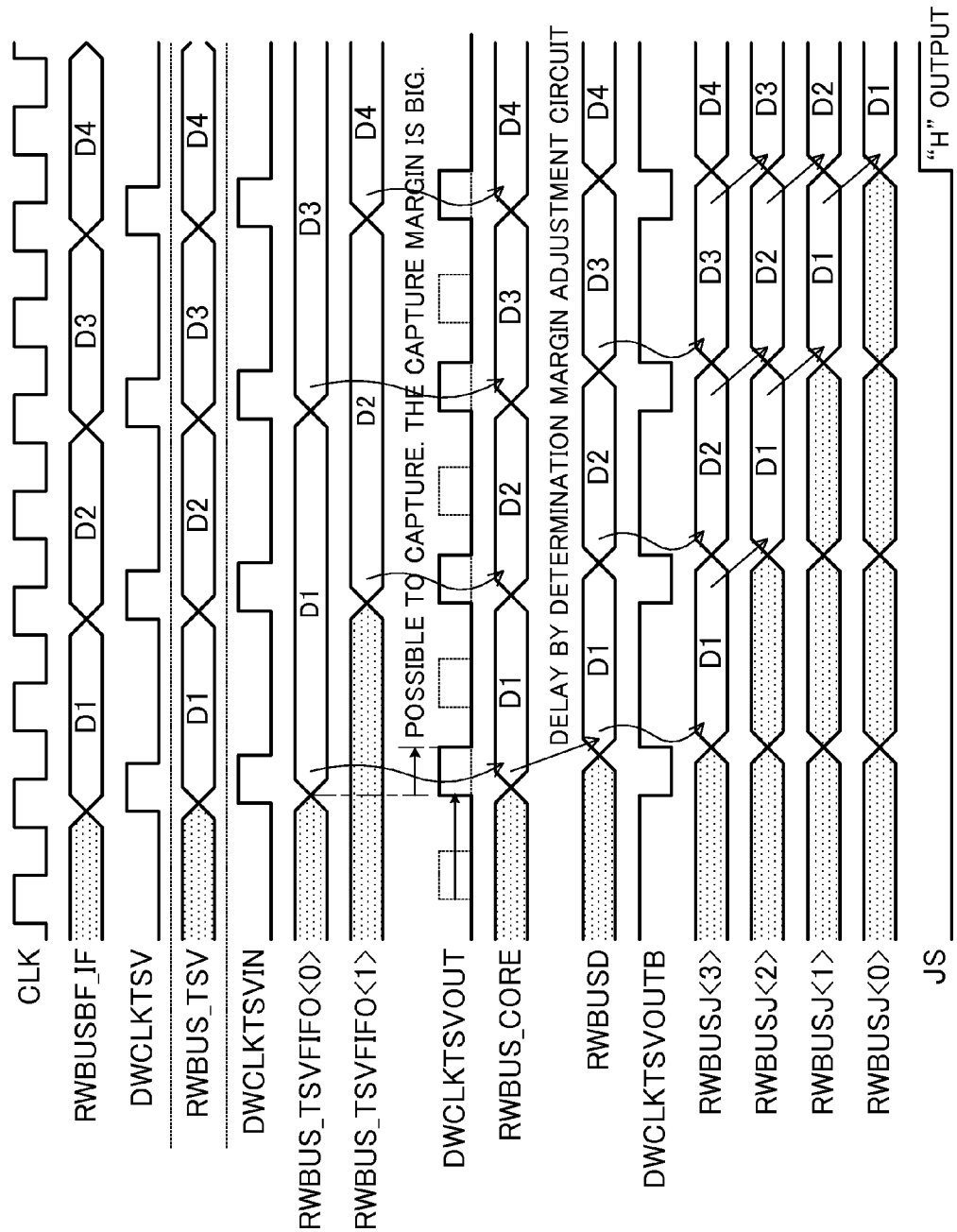

FIGS. 18, 19, and 20 are diagrams showing the operation timing of various signals pertaining to an attempt of the writing operation according to an embodiment of the invention. The signals leading up to the signal RWBUS_TSV are the same as those in FIG. 15. The following description therefore focuses on the portions different from those of FIG. 15.

As in the case of the attempt of the reading operation, in both a high-temperature state (with the temperature equal to or higher than the second temperature) and a low-temperature state (with the temperature lower than the second temperature), an attempt of the writing operation is repeatedly made by incrementing the delay adjustment code signal DACS until the TSV buffer 71 becomes able to capture the write data DQ without fail. The following description focuses on the high-temperature case, but the same is true of the low-temperature case.

FIG. 20 shows a situation where the setting process is completed, i.e. a situation where the TSV buffer 71 is able to capture the write data DQ without fail. As shown in the example, when the TSV buffer 71 is able to capture the write data DQ without fail, data sets D4 to D1 are set for data RWBUSJ<3> to <0> that are input into the determination circuit 63b (FIG. 8) in such a way as to correspond to the last active section of one cycle that is identified by four active sections of the control signal DWCLKTSVOUT. The expectation value determination circuit 63 compares the data RWBUSJ<3> to <0> at that time with the expectation value <3:0>. In the case of FIG. 20, the data RWBUSJ<3> to <0> and the expectation value <3:0> are equal. Therefore, the expectation value determination circuit 63 sets the logical value of the determination signal JS to "High", which indicates "match". As a result, the counter value of the delay adjustment counter circuit 60 at that time is written into the fuse circuit of the counter value latch circuit 61A, and the value of the output signal DACH is settled.

FIG. 18 shows an example of the first of a series of setting processes that are repeatedly performed. In the example, it can be understood from the data RWBUS_CORE shown in FIG. 18 that the TSV buffer 71 (FIG. 8) has failed to capture the write data DQ. The reason is because the control signal DWCLKTSVOUT is ahead of the control signal DWCLKTSVIN (or because of the reverse margin). As a result, the logical value of the determination signal JS is "Low," and the counter value of the delay adjustment counter circuit 60 is increased by one.

FIG. 19 shows an example in which the TSV buffer 71 becomes able to properly capture the write data DQ after several setting processes. However, in this case, the areas where the active periods of the control signal DWCLKTSVOUT and the active sections of the output signal of the TSVFIFO 70 overlap with each other (or the capture margin of the write data DQ) are small. The possibility thus remains that the reverse margin could easily appear as the environment in which the semiconductor device 10 is used changes (or as the temperature, or the power-supply voltage supplied from the outside, changes). Therefore, the TSV buffer 71 may fail to capture the write data DQ. The semiconductor device 10 is configured to continue to make delay adjustments, that is, not to settle the output signal DACH in the above state. The above process is performed by the determination margin adjustment circuit 62, and the details thereof are the same as those of the determination margin adjustment circuit 32 for the read operation. Therefore, the detailed description will be omitted.

As a result of the process by the determination margin adjustment circuit 62, in the example shown in FIG. 19, at the first activation timing of the inverted signal DWCLKTSVOUTB, the data set D1 is not captured in the data RWBUSJ<3>, and the logical value of the determination signal JS is "Low." As a result, the output signal DACH remains unsettled, and the counter value of the delay adjustment counter circuit 60 is increased by one. After that, the setting process continues until the situation shown in FIG. 20 arises.

As described above, the semiconductor device 10 of the present embodiment can change the amount of delay by the delay adjustment circuit 75 depending on the temperature of the chip. Accordingly, compared with an example in which the amount of delay by the delay adjustment circuit 75 is fixed regardless of the temperature, it is possible to reduce the difference (time lag) between the timing at which the write data DQ is captured by the TSVFIFO 70 and the timing at which the TSV buffer 71 captures the write data DQ from the TSVFIFO 70. As a result, the write recovery time tWR can be shortened.

<Configuration of Semiconductor Device 10 According to Second Embodiment of the Invention>

Figure 21:
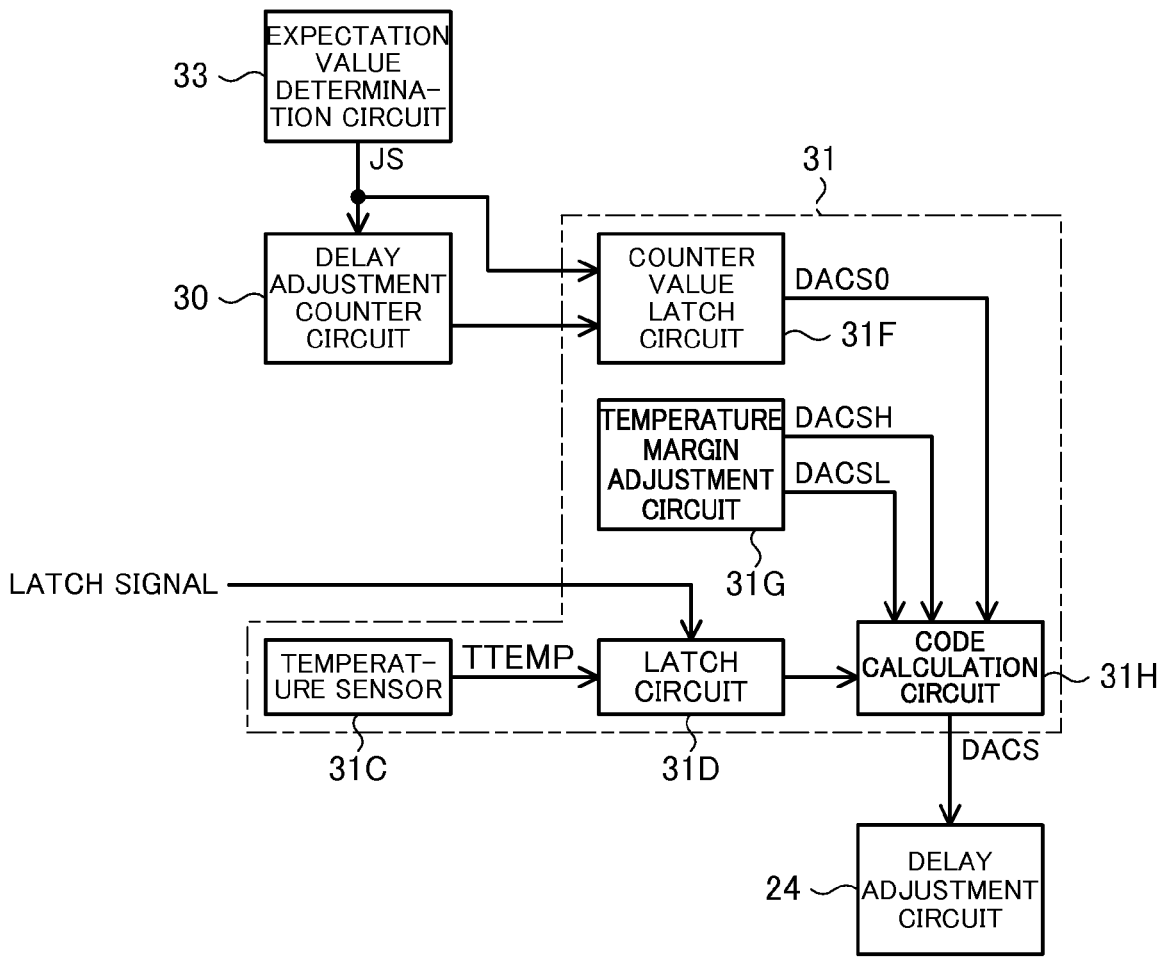
FIG. 21 is a block diagram showing a delay code adjustment circuit according to an second embodiment of the present invention.

FIG. 21 is a block diagram of a delay code adjustment circuit 31 included in a semiconductor device 10 of a second embodiment of the present invention. The delay code adjustment circuit 31 is used during a reading operation.

Figure 22:
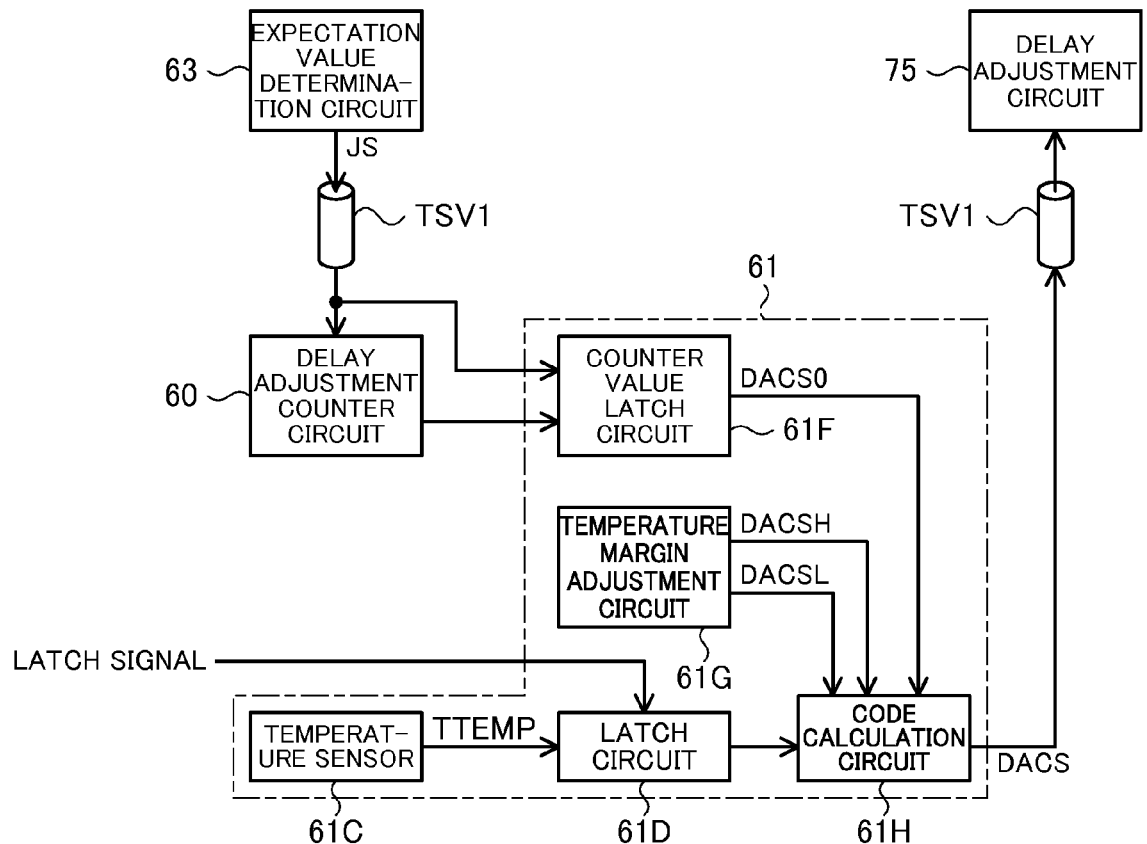
FIG. 22 is a block diagram showing a delay code adjustment circuit according to the second embodiment of the present invention.

FIG. 22 is a block diagram of a delay code adjustment circuit 61 included in the semiconductor device 10 of an embodiment of the present embodiment. The delay code adjustment circuit 61 is used during a writing operation.

As for the semiconductor device 10 of the second embodiment, the internal configuration of the delay code adjustment circuits 31 and 61 is different from that of the semiconductor device 10 of the first embodiment. In other respects, the semiconductor device 10 of the second embodiment is the same as the semiconductor device 10 of the first embodiment. The following detailed description focuses on the differences between the semiconductor device 10 of the second embodiment and the semiconductor device 10 of the first embodiment.

As for the configuration necessary for the reading operation, as can be seen from a comparison between FIG. 11 (first embodiment) and FIG. 21 (second embodiment), instead of the counter value latch circuits 31A and 31B and the selector 31E, the delay code adjustment circuit 31 of the present embodiment includes a counter value latch circuit 31F (third holding circuit), a temperature margin adjustment circuit 31G, and a code calculation circuit 31H.

As for the configuration necessary for the writing operation, as can be seen from a comparison between FIG. 17 (first embodiment) and FIG. 22 (second embodiment), instead of the counter value latch circuits 61A and 61B and the selector 61E, the delay code adjustment circuit 61 of the present embodiment includes a counter value latch circuit 61F, a temperature margin adjustment circuit 61G, and a code calculation circuit 61H.

The configuration of the delay code adjustment circuits 31 and 61 of the second embodiment keeps the advantageous effects of the present invention, or still is able to change the delay adjustment code signal DACS in both the situation where the temperature of the chip is high and the situation where the temperature of the chip is low; the delay code adjustment circuits 31 and 61 of the second embodiment are so modified as not to have to make attempts of the reading or writing operation with varying temperatures in the setting process of the delay adjustment code signal DACS. That is, the semiconductor device 10 of the first embodiment needs to find optimal delay adjustment code signals DACS for both low and high temperatures, resulting in an increase in the costs of tests during the production process compared with an example in which the delay adjustment code signal DACS is fixed regardless of temperature. Since the configuration of the delay code adjustment circuits 31 and 61 has been modified as described above, the semiconductor device 10 of the present embodiment can set the delay adjustment code signal DACS at testing costs almost equal to those of the example in which the delay adjustment code signal DACS is fixed regardless of temperature. The details will be described below.

As for the reading operation, the counter value latch circuit 31F has the same functions as the counter value latch circuits 31A and 31B except that the counter value latch circuit 31F operates regardless of the output signal TTEMP of the temperature sensor 31C. That is, in the initial state, the counter value latch circuit 31F is so configured as to latch the counter value of the delay adjustment counter circuit 30; an output signal DACS0 (third delay code signal) thereof becomes a signal representing the counter value of the delay adjustment counter circuit 30. Once the determination signal JS indicating an affirmative determination result is supplied, the counter value latch circuit 31F is so configured as to set, in the fuse circuit (not shown), the counter value that is latched at that time. The counter value that is set in the fuse circuit is later written to the fuse circuit by laser or the like; since then, the output signal DACS0 has become a signal indicating the value stored in the fuse circuit.

The temperature margin adjustment circuit 31G is a circuit in which a high-temperature temperature margin code DACSH and a low-temperature temperature margin code DACSL are stored. The temperature margin codes DACSH and DACSL are written in advance to the temperature margin adjustment circuit 31G by an external tester or the like.

The code calculation circuit 31H is a circuit that generates, from the output signal DACS0 of the counter value latch circuit 31F, either the output signal DACH or DACL that has been described in the first embodiment, depending on the level of the output signal TTEMP, and outputs the generated signal as a delay adjustment code signal DACS. More specifically, when the potential level of the output signal TTEMP is equal to the first level (or when the temperature of the chip is equal to or higher than the first temperature), the code calculation circuit 31H is so configured as to add the output signal DACSH to the output signal DACS0 and output a resultant signal as a delay adjustment code signal DACS. When the potential level of the output signal TTEMP is equal to the second level (or when the temperature of the chip is lower than the above first temperature), the code calculation circuit 31H is so configured as to add the output signal DACSL to the output signal DACS0 and output a resultant signal as a delay adjustment code signal DACS. As a result, when the temperature of the chip is equal to or higher than the above first temperature, the delay adjustment code signal DACS becomes equivalent to the output signal DACH described in the first embodiment. When the temperature of the chip is lower than the above first temperature, the delay adjustment code signal DACS becomes equivalent to the output signal DACL described in the first embodiment. In this manner, as in the case of the semiconductor device 10 of the first embodiment, the semiconductor device 10 of the present embodiment is able to change the amount of delay by the delay adjustment circuit 24 depending on the temperature of the chip.

Moreover, since the delay adjustment code signal DACS is calculated as described above, the output signal DACS0 of the counter value latch circuit 31F is required to be set in an attempt of the reading operation. Accordingly, as for the reading operation, it is possible to set the delay adjustment code signal DACS at testing costs almost equal to those of the example in which the delay adjustment code signal DACS is fixed regardless of temperature.

The same is true for the writing operation. That is, because of the operation of the counter value latch circuit 61F, the temperature margin adjustment circuit 61G, and the code calculation circuit 61H, the semiconductor device 10 of the present embodiment can change the amount of delay by the delay adjustment circuit 75 depending on the temperature of the chip, as in the case of the first embodiment. Also, as for the writing operation, it is possible to set the delay adjustment code signal DACS at testing costs almost equal to those of the example in which the delay adjustment code signal DACS is fixed regardless of temperature. The details of how each circuit operates will not be described since the operations are similar to those of the reading operation.

Figure 23:
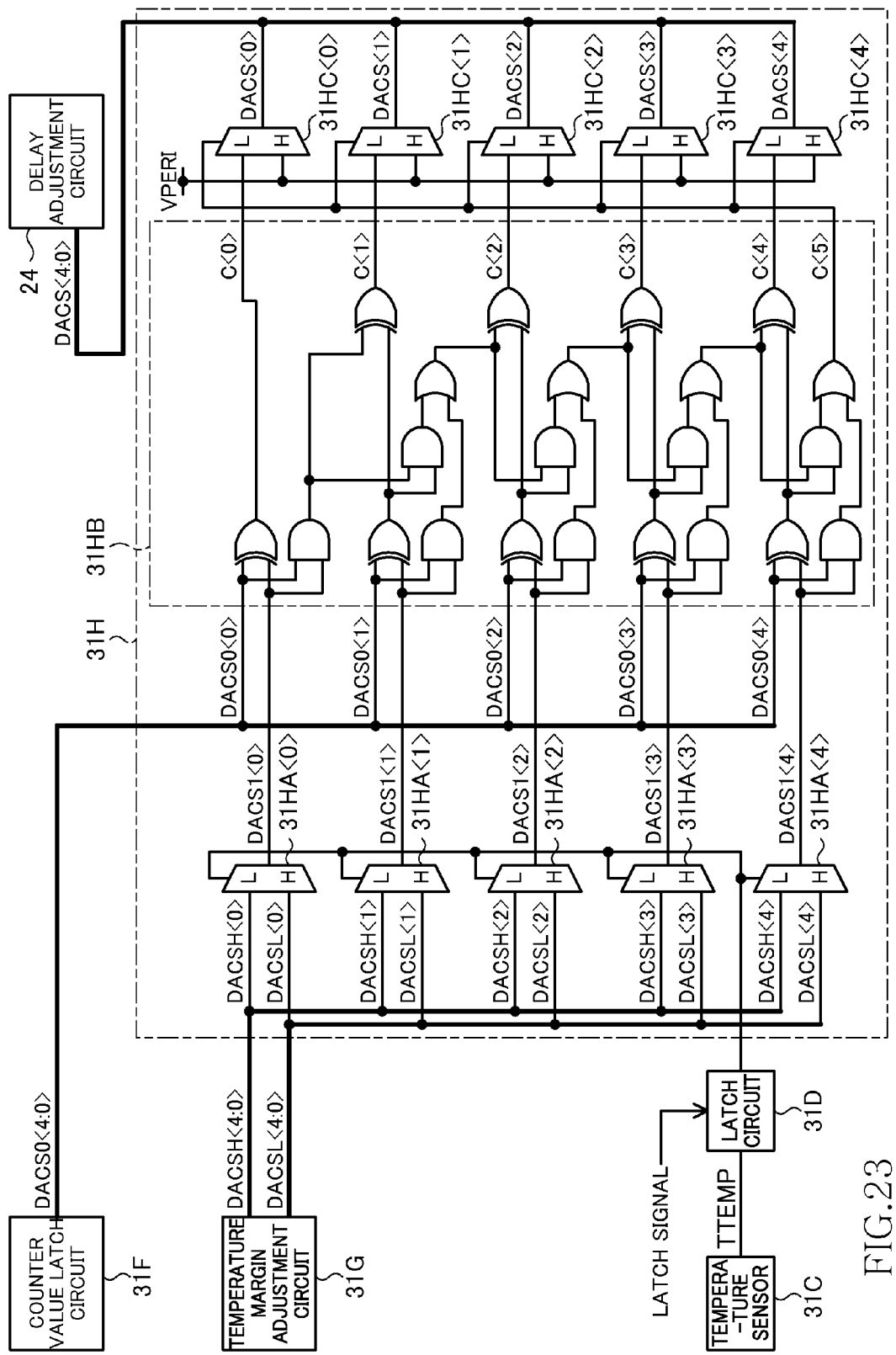
FIG. 23 is a circuit diagram showing a code calculation circuit according to an embodiment of the invention.

FIG. 23 is a circuit diagram showing one example of the internal configuration of the code calculation circuit 31H shown in FIG. 21. This diagram shows an example of the code calculation circuit 31H. However, the same is true of the code calculation circuit 61H. Incidentally, in FIG. 23, the output signal DACS0, the temperature margin codes DACSH and DACSL, and the delay adjustment code signal DACS all are five-bit data, and the description below is based on this assumption. The number of bits of those signals may not be five.

In this example, as shown in FIG. 23, the code calculation circuit 31H includes selectors 31HA<0> to 31HA<4>, an adder 31HB, and selectors 31HC<0> to 31HC<4>.

The selector 31HA<x> (x is an integer ranging from 0 to 4) is a circuit that includes two input terminals, a selection terminal, and an output terminal. To the two input terminals of the selector 31HA<x>, temperature margin codes DACSH<x> and DACSL<x> are respectively supplied. To the selection terminal of the selector 31HA<x>, the output signal TTEMP of the latch circuit 31D is supplied. When the potential level of the output signal TTEMP is equal to the first level (or when the temperature of the chip is equal to or higher than the above first temperature), the selector 31HA<x> outputs the temperature margin code DACSH<x> as an output signal DACS1<x>. When the potential level of the output signal TTEMP is equal to the second level (or when the temperature of the chip is lower than the above first temperature), the selector 31HA<x> outputs the temperature margin code DACSL<x> as an output signal DACS1<x>.

The adder 31HB is a circuit that adds output signals DACS0<4:0> ("DACS0<4:0>" means DACS0<0> to DACS0<4>; the same is true for other signals as well, hereinafter) of the counter value latch circuit 31F and output signals DACS1<4:0> of the selectors 31HA<0> to 31HA<4>. The results of addition are output as total signals C<5:0> from the adder 31HB. Incidentally, since five-bit information is added up, the results of addition are information of up to six bits.

The selectors 31HC<0> to 31HC<4> are circuits that generate, based on the total signals C<5:0>, delay adjustment code signals DACS<4:0>. More specifically, the selector 31HC<x> includes two input terminals, a selection terminal, and an output terminal. To the two input terminals of the selector 31HC<x>, the total signal C<x> and power-supply voltage VPERI are respectively supplied. Incidentally, the power-supply voltage VPERI is an operation voltage of each of the circuits of the semiconductor device 10 that include the delay code adjustment circuit 31; the power-supply voltage VPERI is equal to the potential of the total signal C<x> corresponding to "1." To the selection terminal of the selector 31HC<x>, the total signal C<5> is supplied. The selector 31HC<x> is so configured as to output the total signal C<x> as a delay adjustment code signal DACS<x> when the total signal C<5> is at low level (0), and to output the power-supply voltage VPERI as a delay adjustment code signal DACS<x> when the total signal C<5> is at high level (1).

The selectors 31HC<0> to 31HC<4> are configured as described above. Therefore, if the results of addition by the adder 31HB exceed a maximum value of 31 of information represented by five bits, each bit of the delay adjustment code signals DACS<4:0> becomes "1." That is, the delay adjustment code signals DACS<4:0> become signals representing "31." In other cases, each bit of the delay adjustment code signals DACS<4:0> becomes equal to a corresponding bit of the total signals C<4:0>. That is, the results of addition by the adder 31HB are output as the delay adjustment code signals DACS<4:0> without being changed.

As described above, in both the reading and writing operation, the semiconductor device 10 of the present embodiment can set the delay adjustment code signal DACS at testing costs almost equal to those of the example in which the delay adjustment code signal DACS is fixed regardless of temperature.

It is apparent that the present invention is not limited to the above embodiments, but may be modified and changed without departing from the scope and spirit of the invention.

For example, in each of the above embodiments, what is described is an example in which the present invention is applied to both the reading and writing operations. However, the present invention may be applied to either the reading or writing operation when necessary.

Moreover, in each of the above embodiments, in both the high-temperature case and the low-temperature case, the delay adjustment code signal DACS can be changed. However, the present invention is not limited to such a two-stage change. The present invention may be applied to changes that are made in three or more stages.

What is claimed is:
1. An apparatus comprising:
a first semiconductor chip including a first electrode; and
a second semiconductor chip including a second electrode connected to the first electrode,
one of the first and second semiconductor chips including:
a first temperature sensor circuit generating a first detection signal, the first detection signal taking a first level when a temperature is equal to or higher than a first temperature, the first detection signal taking a second level when the temperature is lower than the first temperature; and
a first delay code generation circuit outputting a first delay code signal in response to the first level of the first detection signal, and outputting a second delay code signal in response to the second level of the first detection signal, the first and second delay code signals being different from each other.
2. The apparatus as claimed in claim 1, wherein
the one of the first and second semiconductor chips further includes:
a first holding circuit that holds the first delay code signal; and
a second holding circuit that holds the second delay code signal, and
the first delay code generation circuit outputs one of the first delay code signal held by the first holding circuit and the second delay code signal held by the second holding circuit in response to the first detection signal.
3. The apparatus as claimed in claim 1, wherein
the one of the first and second semiconductor chips further includes a third holding circuit that holds a third delay code signal, and the first delay code generation circuit generates one of the first delay code signal and the second delay code signal in response to the third delay code signal held by the third holding circuit and the first detection signal.

4. The apparatus as claimed in claim 1, wherein the one of the first and second semiconductor chips further includes:
a first command generation circuit that generates a first internal command in response to a command;
a first delay adjustment circuit that delays, based on a first amount of delay, the first internal command to generate a delayed first internal command; and
a first timing adjustment circuit that generates a first control signal in response to the delayed first internal command.

5. The apparatus as claimed in claim 4, wherein the first delay adjustment circuit sets, when the command is a read command, the first amount of delay based on one of the first delay code signal and second delay code signal that is output from the first delay code generation circuit.

6. The apparatus as claimed in claim 4, wherein the other one of the first and second semiconductor chips includes:
a second command generation circuit that generates a second internal command in response to the command;
a second delay adjustment circuit that delays, based on a second amount of delay, the second internal command to generate a delayed second internal command; and
a second timing adjustment circuit that generates a second control signal in response to the delayed second internal command.

7. The apparatus as claimed in claim 6, wherein
the one of the first and second semiconductor chips further includes:
a second temperature sensor circuit that generates a second detection signal, the second detection signal taking a third level when the temperature is equal to or higher than a second temperature, the second detection signal taking a fourth level when the temperature is lower than the second temperature; and
a second delay code generation circuit that outputs a third delay code signal in response to the third level of the second detection signal, and outputs a fourth delay code signal different from the third delay code signal in response to the fourth level of the second detection signal, and
the second delay adjustment circuit sets, when the command is a write command, the second amount of delay based on one of the third delay code signal and fourth delay code signal that is output from the second delay code generation circuit.

8. The apparatus as claimed in claim 7, wherein the first electrode transmits the third delay code signal or the fourth delay code signal.

9. The apparatus as claimed in claim 1, wherein the one of the first and second semiconductor chips is a control chip that controls the other of the first and second chips.

10. The apparatus as claimed in claim 1, wherein the other of the first and second semiconductor chips comprises a plurality of memory cells.

11. The apparatus as claimed in claim 1, wherein the first electrode includes a first through substrate via, and the second electrode includes a second through substrate via.

12. The apparatus as claimed in claim 1, further comprising:
a third semiconductor chip including a third electrode connected to the second electrode.

13. A method comprising:
sensing a temperature of a device comprising a first semiconductor chip including a first electrode and a second semiconductor chip including a second electrode connected to the first electrode;
generating a first detection signal taking one of first and second levels in response to the temperature; and
generating a first delay code signal in response to the first level of the first detection signal and generating a second delay code signal in response to the second level of the first detection signal, the first and second delay code signals being different from each other.

14. The method as claimed in claim 13, comprising:
delaying a control signal in response to one of the first and second delay code signals to generate a delayed control signal.

15. The method as claimed in claim 14, comprising:
sending a data signal in response to the control signal; and
receiving the data signal in response to the delayed control signal.

16. The method as claimed in claim 13, comprising:
transferring a data signal between the first and second electrodes.

17. An apparatus comprising:
a memory controller;
a device on which the memory controller performs at least one of a write leveling and a read leveling,
the device comprising first and second chips on which a timing adjustment of inputting and outputting of data are performed, and
the device comprising a first circuit configured to generate one of first and second delay code signals in response to a temperature to perform the timing adjustment of inputting and outputting of data, the first and second delay code signals being different from each other.

18. The apparatus as claimed in claim 17, wherein
the write leveling is a process in which the memory controller adjusts a timing when a write data reaches the device, and
the read leveling is a process in which the memory controller detects a timing when a read data is output from the device.

19. The apparatus as claimed in claim 17, wherein a delay amount produced based on the first delay code signal is different from a delay amount produced based on the second delay code signal.

20. The apparatus as claimed in claim 17, wherein the device further comprises a temperature sensor circuit sensing the temperature.

* * * * *